(12) United States Patent
Agarwal et al.

(10) Patent No.: US 10,269,414 B2
(45) Date of Patent: Apr. 23, 2019

(54) BIT-LINE SENSING FOR CORRELATED ELECTRON SWITCH ELEMENTS

(71) Applicant: ARM Ltd., Cambridge (GB)

(72) Inventors: Piyush Agarwal, Noida (IN); Shruti Aggarwal, Noida (IN); Mudit Bhargava, Austin, TX (US); Akshay Kumar, New Delhi (IN)

(73) Assignee: ARM Ltd., Cambridge (GB)

( * ) Notice: Subject to any disclaimer, the term of this patent is extended or adjusted under 35 U.S.C. 154(b) by 0 days.

(21) Appl. No.: 15/590,965

(22) Filed: May 9, 2017

(65) Prior Publication Data
US 2018/0330777 A1 Nov. 15, 2018

(51) Int. Cl.
G11C 7/06 (2006.01)
G11C 11/4097 (2006.01)
G11C 7/18 (2006.01)
G06F 12/0804 (2016.01)
G11C 7/10 (2006.01)
G11C 7/08 (2006.01)
G11C 7/12 (2006.01)
G11C 13/00 (2006.01)

(52) U.S. Cl.
CPC ...... G11C 11/4097 (2013.01); G06F 12/0804 (2013.01); G11C 7/065 (2013.01); G11C 7/08 (2013.01); G11C 7/1006 (2013.01); G11C 7/12 (2013.01); G11C 7/18 (2013.01); G11C 13/0002 (2013.01); G11C 13/0004 (2013.01); G11C 13/0007 (2013.01); G11C 13/0026 (2013.01); G11C 13/0033 (2013.01); G11C 13/0061 (2013.01); G11C 2013/0045 (2013.01); G11C 2207/002 (2013.01)

(58) Field of Classification Search
CPC ....... G11C 11/4097; G11C 7/12; G11C 7/065; G11C 7/08; G11C 7/18; G11C 7/1006; G11C 13/0069; G11C 13/0004; G11C 13/0007; G11C 2213/79; G11C 2213/72; G06F 12/0804
See application file for complete search history.

(56) References Cited

U.S. PATENT DOCUMENTS 4,982,363 A * 1/1991 Sood ............... G11C 7/067
327/51
7,298,640 B2 11/2007 Chen et al.
(Continued)

FOREIGN PATENT DOCUMENTS

EP 3026672 A1 6/2016

OTHER PUBLICATIONS

Notification of Transmittal of the International Search Report and the Written Opinion of the International Searching Authority, or the Declaration, App. No. PCT/GB2018/051199, dated Jul. 20, 2018, 15 Pages.

Primary Examiner — Harry W Byrne
Assistant Examiner — Sultana Begum
(74) Attorney, Agent, or Firm — Berkeley Law & Technology Group, LLP

(57) ABSTRACT

To sense an impedance state of one or more correlated electron switch elements, a bit-line may be precharged to a voltage level that is less than a precharge voltage level for a sense amplifier, and a bit-line may be discharged through one or more correlated electron switch elements. A bit-line may be buffered from a sense amplifier via an electronic switch device.

20 Claims, 10 Drawing Sheets

(56) References Cited

U.S. PATENT DOCUMENTS

| | | | |
|---|---|---|---|
| 7,639,523 | B2 | 12/2009 | Celinska et al. |
| 7,778,063 | B2 | 8/2010 | Brubaker et al. |
| 7,872,900 | B2 | 1/2011 | Paz de Araujo et al. |
| 9,558,819 | B1 | 1/2017 | Aitken et al. |
| 9,584,118 | B1 | 2/2017 | Dao et al. |
| 9,589,636 | B1 | 3/2017 | Bhavnagarwala et al. |
| 9,627,615 | B1 | 4/2017 | Reid et al. |
| 2004/0130959 | A1* | 7/2004 | Kawaguchi ........... G11C 11/406 365/222 |
| 2007/0253237 | A1 | 11/2007 | Tsuchida |
| 2008/0062741 | A1* | 3/2008 | Choi ................. G11C 13/0004 365/148 |
| 2008/0106926 | A1 | 5/2008 | Brubaker |
| 2008/0107801 | A1 | 5/2008 | Celinska et al. |
| 2013/0200323 | A1 | 8/2013 | Pham et al. |
| 2013/0214232 | A1 | 8/2013 | Tendulkar et al. |
| 2013/0285699 | A1* | 10/2013 | McWilliams ........ H03K 19/173 326/41 |
| 2014/0104926 | A1 | 4/2014 | Sutardja et al. |
| 2014/0153320 | A1* | 6/2014 | Yamagami ........... G11C 11/413 365/154 |
| 2014/0153346 | A1* | 6/2014 | Roy ..................... G11C 11/419 365/189.15 |
| 2017/0033782 | A1 | 2/2017 | Shifren et al. |
| 2017/0045905 | A1 | 2/2017 | Sandhu et al. |
| 2017/0047116 | A1 | 2/2017 | Sandhu et al. |
| 2017/0047919 | A1 | 2/2017 | Sandhu et al. |
| 2017/0069378 | A1 | 3/2017 | Shifren et al. |

* cited by examiner

BIT-LINE SENSING FOR CORRELATED ELECTRON SWITCH ELEMENTS

BACKGROUND

Field

Subject matter disclosed herein may relate to correlated electron switch elements, and may relate more particularly to sensing impedance states of correlated electron switch elements.

Information

Integrated circuit devices, such as electronic switching devices, for example, may be found in a wide range of electronic circuit types in a wide range of electronic devices. For example, memory, logic, analog, and/or other electronic circuit types may incorporate electronic switches that may be used in computers, digital cameras, cellular telephones, tablet devices, personal digital assistants, etc. Factors related to electronic switching devices, such as may be incorporated in memory, logic, analog, and/or other electronic circuit types, that may be of interest to a designer in considering suitability for any particular application may include physical size, storage density, operating voltages, impedance ranges and/or power consumption, for example. Other example factors that may be of interest to designers may include, for example, cost of manufacture, ease of manufacture, scalability, and/or reliability. Moreover, there appears to be an ever increasing need for memory, logic, analog, and/or other electronic circuit types that exhibit characteristics of lower power, lower cost, and/or greater performance.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1B:
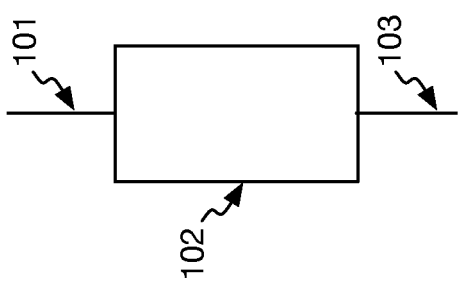
FIG. 1b depicts an illustration of an example symbol for a correlated electron switch device, in accordance with an embodiment.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment, and/or the like means that a particular feature, structure, characteristic, and/or the like described in relation to a particular implementation and/or embodiment is included in at least one implementation and/or embodiment of claimed subject matter. Thus, appearances of such phrases, for example, in various places throughout this specification are not necessarily intended to refer to the same implementation and/or embodiment or to any one particular implementation and/or embodiment. Furthermore, it is to be understood that particular features, structures, characteristics, and/or the like described are capable of being combined in various ways in one or more implementations and/or embodiments and, therefore, are within intended claim scope. In general, of course, as has always been the case for the specification of a patent application, these and other issues have a potential to vary in a particular context of usage. In other words, throughout the disclosure, particular context of description and/or usage provides helpful guidance regarding reasonable inferences to be drawn; however, likewise, "in this context" in general without further qualification refers to the context of the present disclosure.

Particular aspects of the present disclosure describe example embodiments utilizing electron materials (CEMs) in correlated electron switch (CES) devices, for example, such as may be utilized to form a correlated electron random access memory (CERAM), such may include one or more CES elements, in memory and/or logic devices, and/or such as may be utilized in any number of other circuit and/or device types, for example. Correlated electron materials, which may be utilized in the construction of CERAM devices and CES devices, for example, may also be utilized in a wide range of other electronic circuit types, such as, for example, memory controllers, memory arrays, processors, microcontrollers, filter circuits, data converters, optical instruments, phase locked loop circuits, microwave and millimeter wave transceivers, and so forth, although claimed subject matter is not limited in scope in these respects. In this context, a CES device may exhibit a substantially rapid conductor-to-insulator transition, which may be brought about by electron correlations rather than solid state structural phase changes, such as in response to a change from a crystalline to an amorphous state, for example, in a phase change memory device or, in another example, formation of filaments in conductive and resistive RAM devices. In one aspect, a substantially rapid conductor-to-insulator transition in a CES device may be responsive to a quantum mechanical phenomenon, in contrast to melting/solidification or filament formation, for example, in phase change and resistive RAM devices. Such quantum mechanical transitions between relatively conductive and relatively insulative states, and/or between first and second impedance states, for example, in a CEM may be understood in any one of several aspects. As used herein, the terms "relatively conductive state," "relatively lower impedance state," and/or "metal state" may be interchangeable, and/or may, at times, be referred to as a "relatively conductive/lower impedance state." Similarly, the terms "relatively insulative state" and "relatively higher impedance state" may be used interchangeably herein, and/or may, at times, be referred to as a "relatively insulative/higher impedance state."

In an aspect, a quantum mechanical transition of a CEM between a relatively insulative/higher impedance state and a relatively conductive/lower impedance state, wherein the relatively conductive/lower impedance state is substantially dissimilar from the insulated/higher impedance state, may be understood in terms of a Mott transition. In accordance with a Mott transition, a material may switch from a relatively insulative/higher impedance state to a relatively conductive/lower impedance state if a Mott transition condition occurs. The Mott criteria may be defined by $(n_c)^{1/3} a \approx 0.26$, wherein $n_c$ denotes a concentration of electrons, and wherein "a" denotes the Bohr radius. If a threshold carrier concentration is achieved, such that the Mott criteria is met, the Mott transition is believed to occur. Responsive to the Mott transition occurring, the state of a CES device changes from a relatively higher resistance/higher capacitance state (e.g., an insulative/higher impedance state) to a relatively lower resistance/lower capacitance state (e.g., a conductive/lower impedance state) that is substantially dissimilar from the higher resistance/higher capacitance state.

In another aspect, the Mott transition may be controlled by a localization of electrons. If carriers, such as electrons, for example, are localized, a strong coulomb interaction between the carriers is believed to split the bands of a CEM to bring about a relatively insulative (relatively higher impedance) state. If electrons are no longer localized, a weak coulomb interaction may dominate, which may give rise to a removal of band splitting, which may, in turn, bring about a metal (conductive) band (relatively lower impedance state) that is substantially dissimilar from the relatively higher impedance state.

Further, in an embodiment, transitioning from a relatively insulative/higher impedance state to a substantially dissimilar and relatively conductive/lower impedance state may bring about a change in capacitance in addition to a change in resistance. For example, a CEM may exhibit a variable resistance together with a property of variable capacitance. In other words, impedance characteristics of a CEM may include both resistive and capacitive components. For example, in a metal state, a CEM may comprise a relatively low electric field that may approach zero, and therefore may exhibit a substantially low capacitance, which may likewise approach zero.

Similarly, in a relatively insulative/higher impedance state, which may be brought about by a higher density of bound or correlated electrons, an external electric field may be capable of penetrating a CEM and, therefore, a CEM may exhibit higher capacitance based, at least in part, on additional charges stored within a CEM. Thus, for example, a transition from a relatively insulative/higher impedance state to a substantially dissimilar and relatively conductive/lower impedance state in a CEM device may result in changes in both resistance and capacitance, at least in particular embodiments. Such a transition may bring about additional measurable phenomena, and claimed subject matter is not limited in this respect.

In an embodiment, a device formed from a CEM may exhibit switching of impedance states responsive to a Mott-transition in a majority of the volume of a CEM comprising a device. In an embodiment, a CEM may form a "bulk switch." As used herein, the term "bulk switch" refers to at least a majority volume of a CEM switching a device's impedance state, such as in response to a Mott-transition. For example, in an embodiment, substantially all CEM of a device may switch from a relatively insulative/higher impedance state to a relatively conductive/lower impedance state or from a relatively conductive/lower impedance state to a relatively insulative/higher impedance state responsive to a Mott-transition. In an embodiment, a CEM may comprise one or more transition metals, one or more transition metal compounds, one or more transition metal oxides (TMOs), one or more oxides comprising rare earth elements, one or more oxides of one or more f-block elements of the periodic table, one or more rare earth transitional metal oxide perovskites, yttrium, and/or ytterbium, although claimed subject matter is not limited in scope in this respect. In an embodiment, a CEM may comprise one or more materials selected from a group comprising aluminum, cadmium, chromium, cobalt, copper, gold, iron, manganese, mercury, molybdenum, nickel, palladium, rhenium, ruthenium, silver, tin, titanium, vanadium, yttrium, and zinc (which may be linked to a cation, such as oxygen or other types of ligands), or combinations thereof, although claimed subject matter is not limited in scope in this respect.

Figure 1A:
FIG. 1a shows block diagram of an example embodiment of a correlated electron switch device comprising a correlated electron material, in accordance with an embodiment.

FIG. 1a shows an example embodiment 100 of a CES device comprising CEM, such as one or more materials 102, sandwiched between conductive terminals, such as conductive terminals 101 and 103. In an embodiment, a CES device, such as CES device 100, may comprise a variable impeder device. As utilized herein, the terms "correlated electron switch" and "variable impeder" may be interchangeable. At least in part through application of a critical voltage and a critical current between the terminals, such as between conductive terminals 101 and 103, a CEM, such as material 102, may transition between aforementioned relatively conductive/lower impedance states and relatively insulative/higher impedance states. As mentioned, a CEM, such as one or more materials 102, in a variable impeder device, such as CES device 100, may transition between a first impedance state and a second impedance state due to a quantum mechanical transition of the correlated electron switch material as a result an applied critical voltage and an applied critical current, as described in more detail below. Also, as mentioned above, a variable impeder device, such as variable impeder device 100, may exhibit properties of both variable resistance and variable capacitance.

FIG. 1b depicts an example symbol 110 that may be utilized, for example, in electrical circuit schematic diagrams to notate a CES/variable impeder device. Example symbol 110 is meant to remind the viewer of the variable resistance and variable capacitance properties of a CES/variable impeder device, such as CES device 100. Example symbol 110 is not meant to represent an actual circuit diagram, but is merely meant as an electrical circuit diagram symbol. Of course, claimed subject matter is not limited in scope in these respects.

Figure 2:
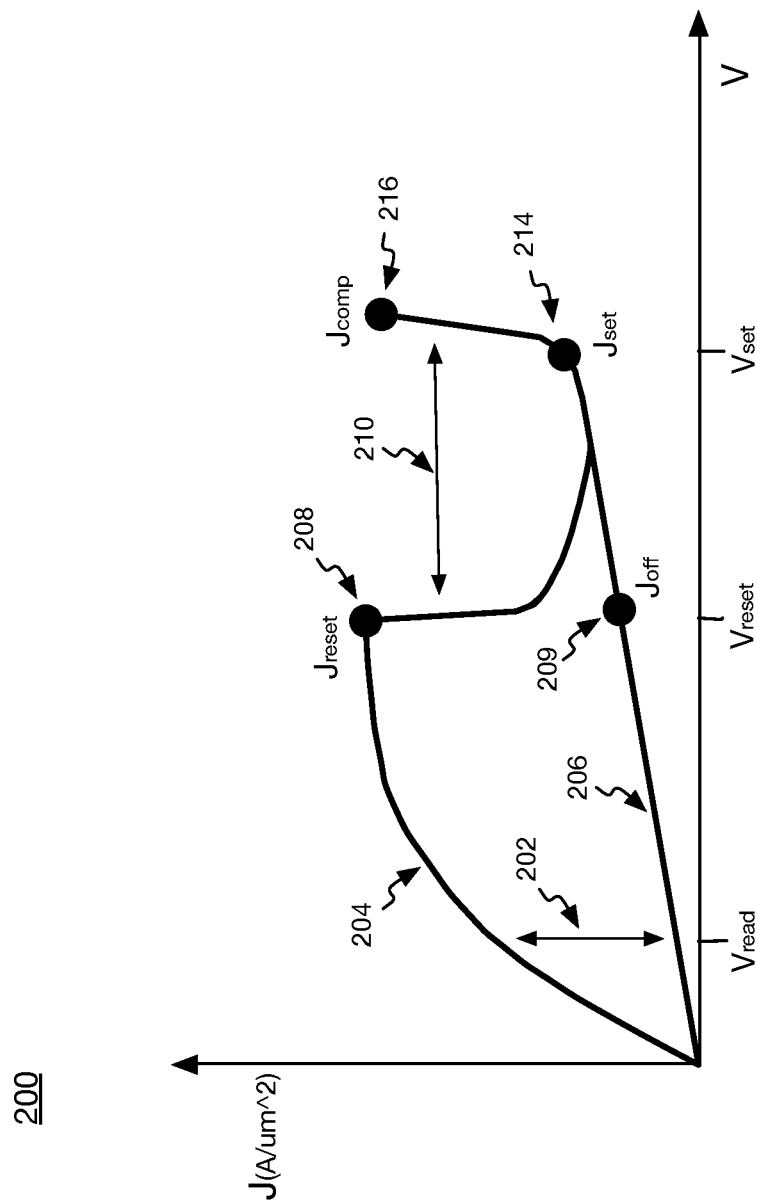
FIG. 2 shows an example plot of current density versus voltage for a correlated electron switch device, in according to an embodiment.

FIG. 2 is a diagram showing an example voltage versus current density profile of a device formed from a CEM according to an embodiment 200. Based, at least in part, on a voltage applied to terminals of a CEM device, for example, during a "write operation," a CEM device may be placed into a relatively low-impedance state or a relatively high-impedance state. For example, application of a voltage $V_{set}$ and a current density $J_{set}$ may place a CEM device into a relatively lower-impedance state. Conversely, application of a voltage $V_{reset}$ and a current density $J_{reset}$ may place a CEM device into a relatively higher-impedance state. As shown in FIG. 2, reference designator 210 illustrates the voltage range that may separate $V_{set}$ from $V_{reset}$. Following placement of a CEM device into a relatively higher-impedance state or relatively lower-impedance state, the particular state of a CEM device may be detected by application of a voltage $V_{read}$ (e.g., during a read operation) and detection of a current or current density at terminals of a CEM device.

According to an embodiment, a CEM device of FIG. 2 may include any transition metal oxide (TMO), such as, for example, perovskites, Mott insulators, charge exchange insulators, and Anderson disorder insulators. In particular implementations, a CEM device may be formed from switching materials, such as nickel oxide, cobalt oxide, iron oxide, yttrium oxide, and perovskites, such as chromium doped strontium titanate, lanthanum titanate, and the manganate family including praseodymium calcium manganate, and praseodymium lanthanum manganite, just to provide a few examples. In particular, oxides incorporating elements with incomplete "d" and "f" orbital shells may exhibit sufficient impedance switching properties for use in a CEM device. Other implementations may employ other transition metal compounds without deviating from claimed subject matter.

In one aspect, a CEM device of FIG. 2 may comprise materials of the general form AB:$L_x$ (such as NiO:CO) where AB represents a transition metal, transition metal compound, or transition metal oxide variable impedance material and $L_x$ represents a dopant ligand; though it should be understood that these are exemplary only and are not intended to limit claimed subject matter. Particular implementations may employ other variable impedance materials as well. Nickel oxide, NiO, is disclosed as one particular TMO. NiO materials discussed herein may be doped with extrinsic ligands, $L_x$ which may establish and/or stabilize variable impedance properties. In particular, NiO variable impedance materials disclosed herein may include a carbon-containing ligand such as carbonyl (CO), forming NiO:CO. In another particular example, NiO doped with extrinsic ligands may be expressed as NiO:$L_x$, where $L_x$ is a ligand element or compound and x indicates a number of units of the ligand for one unit of NiO. One skilled in the art may determine a value of x for any specific ligand and any specific combination of ligand with NiO or any other transition metal compound simply by balancing valences. In particular, NiO variable impedance materials disclosed herein may include carbon containing molecules of the form $C_aH_bN_dO_f$ (in which a≥1, and b, d and f≥0) such as: carbonyl (CO), cyano (CN$^-$), ethylene diamine ($C_2H_8N_2$), phen(1,10-phenanthroline) ($C_{12}H_8N_2$), bipyridine ($C_{10}H_8N_2$), ethylenediamine (($C_2H_4(NH_2)_2$), pyridine ($C_5H_5N$), acetonitrile ($CH_3CN$), and cyanosulfanides such as thiocyanate (NCS$^-$), for example.

In accordance with FIG. 2, if sufficient bias is applied (e.g., exceeding a band-splitting potential) and the aforementioned Mott condition is satisfied (e.g., injected electron holes are of a population comparable to a population of electrons in a switching region, for example), a CEM device may switch from a relatively low-impedance state to a substantially dissimilar impedance state, such as a relatively high-impedance state, responsive to a Mott transition. This may correspond to point 208 of the voltage versus current density profile of FIG. 2. At, or suitably nearby this point, electrons are no longer screened and become localized. This correlation may result in a strong electron-electron interaction potential which may operate to split the bands to form a relatively high-impedance material. If a CEM device comprises a relatively high-impedance state, current may generated by transportation of electron holes. Consequently, if a threshold voltage is applied across terminals of a CEM device, electrons may be injected into a metal-insulator-metal (MIM) diode over the potential barrier of the MIM device. If a threshold current of electrons is injected and a threshold potential is applied across terminals to place a CEM device into a "set" state, an increase in electrons may screen electrons and remove a localization of electrons, which may operate to collapse the band-splitting potential, thereby bringing about a relatively low-impedance state.

According to an embodiment, current in a CEM device may be controlled by an externally applied "compliance" condition, which may be determined at least partially on the basis of an applied external current, which may be limited during a write operation, for example, to place a CEM device into a relatively high-impedance state. This externally-applied compliance current may, in some embodiments, also set a condition of a current density for a subsequent reset operation to place a CEM device into a relatively high-impedance state. As shown in the particular implementation of FIG. 2, a current density $J_{comp}$ may be applied during a write operation at point 216 to place a CEM device into a relatively high-impedance state and/or to determine a compliance condition for placing a CEM device into a low-impedance state in a subsequent write operation. As shown in FIG. 2, a CEM device may be subsequently placed into a low-impedance state by application of a current density $J_{reset} \geq J_{comp}$ at a voltage $V_{reset}$ at point 208, at which $J_{comp}$ is externally applied.

In embodiments, compliance may set a number of electrons in a CEM device which may be "captured" by holes for the Mott transition. In other words, a current applied in a write operation to place a CEM device into a relatively low-impedance state may determine a number of holes to be injected to a CEM device for subsequently transitioning a CEM device to a relatively high-impedance state.

As pointed out above, a reset condition may occur in response to a Mott transition at point 208. As pointed out above, such a Mott transition may bring about a condition in a CEM device in which a concentration of electrons n approximately equals, or becomes at least comparable to, a concentration of electron holes p. This condition may be modeled according to expression (1) as follows:

$$\lambda_{TF} n^{\frac{1}{3}} = C \sim 0.26 \quad (1)$$
$$n = \left(\frac{C}{\lambda_{TF}}\right)^3$$

In expression (1), $\lambda_{TF}$ corresponds to a Thomas Fermi screening length, and C is a constant.

According to an embodiment, a current or current density in region 204 of the voltage versus current density profile shown in FIG. 2, may exist in response to injection of holes from a voltage signal applied across terminals of a CEM device. Here, injection of holes may meet a Mott transition criterion for the low-impedance state to high-impedance state transition at current $I_{MI}$ as a threshold voltage $V_{MI}$ is applied across terminals of a CEM device. This may be modeled according to expression (2) as follows:

$$I_{MI}(V_{MI}) = \frac{dQ(V_{MI})}{dt} \approx \frac{Q(V_{MI})}{t} \quad (2)$$
$$Q(V_{MI}) = qn(V_{MI})$$

Where $Q(V_{MI})$ corresponds to the charged injected (holes or electrons) and is a function of an applied voltage. Injection of electrons and/or holes to enable a Mott transition may occur between bands and in response to threshold voltage $V_{MI}$, and threshold current $I_{MI}$. By equating electron concentration n with a charge concentration to bring about a Mott transition by holes injected by $I_{MI}$ in expression (2) according to expression (1), a dependency of such a threshold voltage $V_{MI}$ on Thomas Fermi screening length $\lambda_{TF}$ may be modeled according to expression (3), as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \quad (3)$$
$$J_{reset}(V_{MI}) = J_{MI}(V_{MI}) = \frac{I_{MI}(V_{MI})}{A_{CEM}} = \frac{q}{A_{CEM}t}\left(\frac{C}{\lambda_{TF}(V_{MI})}\right)^3$$

In which $A_{CEM}$ is a cross-sectional area of a CEM device; and $J_{reset}(V_{MI})$ may represent a current density through a CEM device to be applied to a CEM device at a threshold voltage $V_{MI}$, which may place a CEM device in a relatively high-impedance state.

Figure 3:
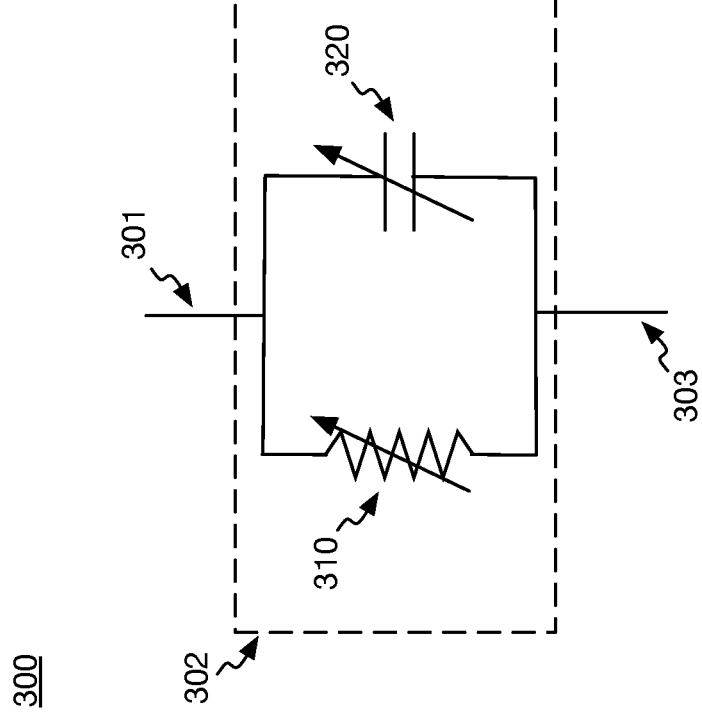
FIG. 3 is a schematic diagram of an equivalent circuit of a correlated electron switch, in accordance with an embodiment.

FIG. 3 depicts a schematic diagram of an equivalent circuit of an example CEM switch device according to an embodiment 300. As previously mentioned, a CEM device, such as a correlated electron switch (CES), a CES element, a CERAM array, and/or other type of device utilizing one or more correlated electron materials may comprise variable or complex impedance device that may exhibit characteristics of both variable resistance and variable capacitance. In other words, impedance characteristics for a CEM variable impedance device, such as the device according to embodiment 300, may depend at least in part on resistance and capacitance characteristics of the device if measured across device terminals 301 and 303, for example. In an embodiment, an equivalent circuit for a variable impedance device may comprise a variable resistor, such as variable resistor 310, in parallel with a variable capacitor, such as variable capacitor 320. Of course, although a variable resistor 310 and variable capacitor 320 are depicted in FIG. 3 as comprising discrete components, a variable impedance device, such as device of embodiment 300, may comprise a substantially homogenous CEM and claimed subject matter is not limited in this respect.

Table 1 below depicts an example truth table for an example variable impedance device, such as the device of embodiment 300.

TABLE 1

| Correlated Electron Switch Truth Table | | |
|---|---|---|
| Resistance | Capacitance | Impedance |
| $R_{high}(V_{applied})$ | $C_{high}(V_{applied})$ | $Z_{high}(V_{applied})$ |
| $R_{low}(V_{applied})$ | $C_{low}(V_{applied})\sim 0$ | $Z_{low}(V_{applied})$ |

In an embodiment, Table 1 shows that a resistance of a variable impedance device, such as the device of embodiment 300, may transition between a low-impedance state and a substantially dissimilar high-impedance state as a function at least partially dependent on a voltage applied across a CEM device. In an embodiment, an impedance exhibited at a low-impedance state may be approximately in the range of 10.0-100,000.0 times lower than a substantially dissimilar impedance exhibited in a high-impedance state. In other embodiments, an impedance exhibited at a low-impedance state may be approximately in the range of 5.0 to 10.0 times lower than an impedance exhibited in a high-impedance state, for example. It should be noted, however, that claimed subject matter is not limited to any particular impedance ratios between high-impedance states and low-impedance states. Truth Table 1 shows that a capacitance of a variable impedance device, such as the device of embodiment 300, may transition between a relatively lower capacitance state, which, in an example embodiment, may comprise approximately zero, or very little, capacitance, and a relatively higher capacitance state that is a function, at least in part, of a voltage applied across a CEM device.

According to an embodiment, a CEM device, which may be utilized to form a CES, a CES element, a CERAM memory device, and/or a variety of other electronic devices comprising one or more correlated electron materials, may be placed into a relatively lower-impedance state, such as by transitioning from a relatively higher-impedance state, for example, via injection of a sufficient quantity of electrons to satisfy a Mott transition criteria. In transitioning a CEM device to a relatively lower-impedance state, if enough electrons are injected and the potential across the terminals of a CEM device overcomes a threshold switching potential (e.g., $V_{set}$), injected electrons may begin to screen. As previously mentioned, screening may operate to un-localize double-occupied electrons to collapse the band-splitting potential, thereby bringing about a relatively lower-impedance state.

As mentioned, integrated circuit devices, such as electronic switching devices, for example, may be found in a wide range of electronic circuit types in a wide range of electronic devices. For example, memory, logic, analog, and/or other electronic circuit types may incorporate electronic switches that may be used in computers, digital cameras, cellular telephones, tablet devices, personal digital assistants, etc. Factors related to electronic switching devices, such as may be incorporated in memory, logic, analog, and/or other electronic circuit types, that may be of interest to a designer in considering suitability for any particular application may include physical size, storage density, operating voltages, impedance ranges and/or power consumption, for example. Other example factors that may be of interest to designers may include, for example, cost of manufacture, ease of manufacture, scalability, and/or reliability. Moreover, there appears to be an ever increasing need for memory, logic, analog, and/or other electronic circuit types that exhibit characteristics of lower power, lower cost, and/or greater performance.

In an embodiment, it may be desirable and/or advantageous to incorporate correlated electron switch (CES) devices in CES elements, such as within a memory array, for example. In an embodiment, different impedance states that may be achieved within CES devices may be used within CES elements to represent different logical values and/or parameters. For example, a CES element programmed to a relatively lower impedance state may represent a binary "1" value, and/or a CES element programmed to a relatively higher impedance state may represent a binary "0" value, in an embodiment, although claimed subject matter is not limited in scope in this respect. Further, in an embodiment, to sense an impedance state of a CES element, sensing circuitry may generate an output signal indicative of a particular impedance state of the CES element at least in part by detecting a rate at which a precharged bit-line is discharged through one or more CES elements, for example, as explained more fully below.

As explained above, a reset condition for a CEM device may be at least in part achieved at a voltage level $V_{reset}$ which, in an embodiment, may be approximately 0.6V. To avoid spurious reset conditions during sensing operations involving CES elements, a bit-line may be precharged to a voltage level less than $V_{reset}$. For example, in an embodiment, a bit-line may be precharged to approximately 0.4V, providing a range of voltage between a bit-line precharge voltage level and $V_{reset}$. However, a relatively low bit-line precharge voltage of 0.4V may present challenges in designing and/or implementing relatively more reliable and/or relatively greater performing sensing circuitry. In an embodiment, a buffer may be provided between one or more CES elements and sensing circuitry to allow the sensing circuitry to operate at a voltage greater than $V_{reset}$ and to allow the CES device element to be precharged to a voltage level less than $V_{reset}$, as explained more fully below.

Figure 4:
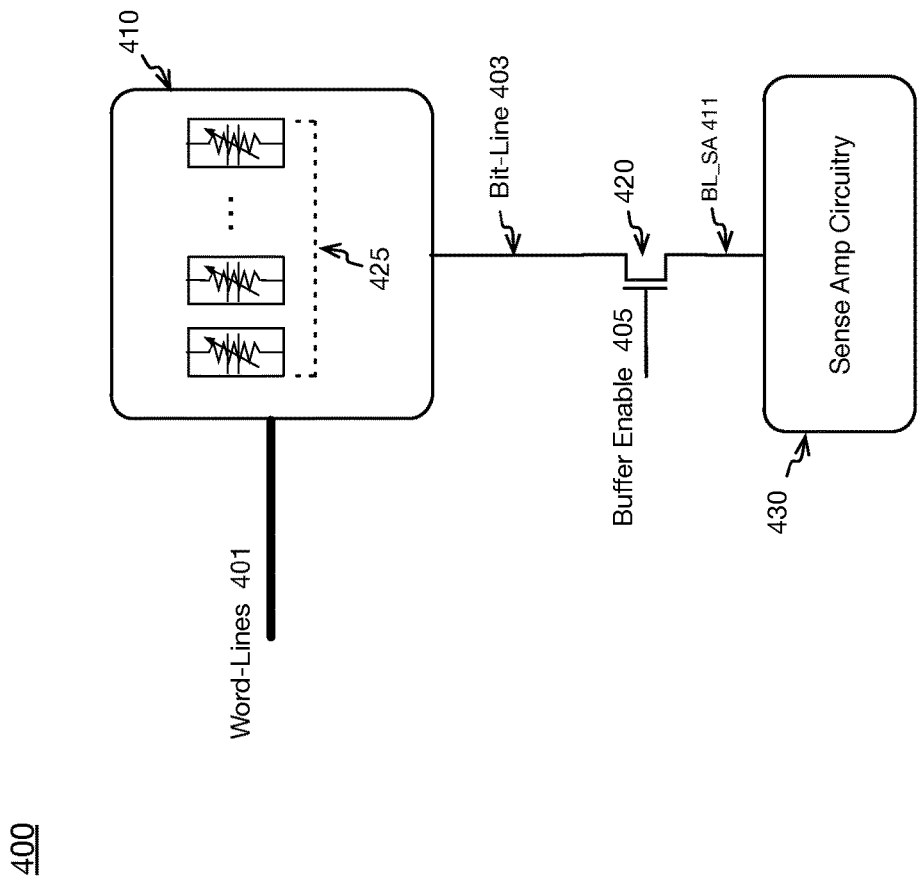
FIG. 4 depicts a schematic block diagram of an example circuit for sensing an impedance state of one or more correlated electron switch elements, in accordance with an embodiment.

FIG. 4 depicts a schematic block diagram of an embodiment 400 of an example circuit for sensing an impedance state of one or more CES elements, such as one or more CES elements 410. As utilized herein, "element", "CES element," and/or the like refers to a circuit and/or portion of a circuit capable of representing a value, symbol, or parameter as a state. For example, a CES element may comprise one or more CES devices capable of representing a value, symbol, or parameter as an impedance state of the one or more CES devices. In particular embodiments, a CES element may represent a value, symbol, or parameter as a single bit or multiple bits.

In an embodiment, one or more CES elements, such as one or more CES elements 410, may comprise one or more CES devices, such as one or more CES devices 425. Sense amplifier circuitry, such as 430, may be electrically coupled to CES elements, such as CES elements 410, via a bit-line, such as bit-line 403, and/or via a buffer device, such as electronic switch 420, in an embodiment. Further, in an embodiment, a buffer, such as electronic switch 420, may be enabled and/or controlled by way of assertion (e.g., logically high voltage level) of a voltage signal, such as buffer enable signal 405.

As utilized herein, "bit-line" refers to a conductor that is connectable to at least one terminal of a CES element during a write operation to communicate a signal altering a state of the CES element, or during a read operation to communicate a signal indicative of a current state of the CES element. Further, as utilized herein, "electronic switch" may refer to a circuit or portion of a circuit capable of electrical conduction in response to a condition. For example, an electronic switch may comprise a three-terminal device, wherein conduction may occur between two terminals of the electronic switch at least in part in response to a voltage and/or current level between one of the two terminals and a third terminal exceeding a threshold voltage and/or current level, such as explained more fully below in connection with example electronic switch 420.

In an embodiment, a bit-line, such as bit-line 403, may be precharged to a voltage level determined, at least in part, by a voltage level applied to a buffer, such as electronic switch 420, and determined, at least in part, by a precharge voltage for a sense amplifier input signal and/or node, such as BL_SA 411, coupled between a buffer, such as electronic switch 420, and sense amplifier circuitry, such as sense amplifier circuitry 430. For example, for an embodiment in which buffer enable signal 405 may have a voltage level of approximately 0.5V, and in which BL_SA 411 may be precharged to 1.2V, a precharge voltage level on bit-line 403 may be 0.4V. Of course, voltage levels described herein are approximate and are merely examples, and claimed subject matter is not limited in scope in these respects.

In an embodiment, sense amplifier circuitry, such as sense amplifier circuitry 430, may detect an impedance state of one or more CES elements, such as one or more of CES elements 425. In an embodiment, one or more CES elements to be sensed may be determined at least in part by as assertion (e.g., logically high voltage level) of one or more word-lines, such as one or more of word-lines 401. In an embodiment, following a precharge period, a bit-line, such as bit-line 403, may be discharged through a CES element, such as one or more of CES elements 425. Also, in an embodiment, a sense amplifier input signal and/or node, such as BL_SA 411, may be discharged through a buffer, such as electronic switch 420, while a bit-line, such as bit-line 403, is discharged through a CES element, such as one or more of CES elements 425. Sense amplifier circuitry, such as sense amplifier circuitry 430, may detect a state of a sense amplifier input signal and/or node, such as BL_SA 411, as the bit-line is discharging and/or following a bit-line discharge. A sense amplifier input signal and/or node, such as BL_SA 411, may discharge at a relatively quicker rate in a situation in which a CES element, such as one or more of CES elements 425, is programmed to a relatively lower impedance state, in an embodiment. Further, in an embodiment, a sense amplifier input signal and/or node, such as BL_SA 411, may discharge at a relatively slower rate in a situation in which a CES element, such as one or more of CES elements 425, is programmed to a relatively higher impedance state. In an embodiment, sense amplifier circuitry, such as sense amplifier circuitry 430, may discern between a relatively higher impedance state and a relatively lower impedance state for one or more CES elements, such as one or more CES elements 425, at least in part by detecting whether a sense amplifier input signal, such as BL_SA 411, is discharged at a relatively quicker rate or a relatively slower rate.

In an embodiment, by limiting a voltage on a bit-line, such as bit-line 403, to a relatively lower voltage level, such as 0.4V, for example, spurious reset conditions for CES elements, such as CES elements 425, may be avoided. Further, by providing a relatively higher voltage for a sense amplifier input signal and/or node, such as BL_SA 411, sense amplifier circuitry, such as 430, may operate in a manner that may provide greater performance and/or greater reliability than would otherwise be the case if operating with lower voltage levels. Thus, in an embodiment, particular design criteria for CES elements, such as CES elements 425, and/or particular design criteria for sense amplifier circuitry, such as sense amplifier circuitry 430, may be met at least in part via the different voltage levels surrounding the CES elements and the sense amplifier circuitry. In an embodiment, the different voltage levels for BL 403 and BL_SA 411, for example, may be determined, at least in part, by a buffer, such as electronic switch 420 and/or by a buffer enable signal, such as buffer enable 405.

Although various embodiments are described herein comprising various configurations of devices and/or components and/or comprising various voltage levels for various signals, claimed subject matter is not limited in scope to the particular examples provided herein. Further, the examples described herein may comprise simplified examples, and the scope of claimed subject matter may include other embodiments comprising different types, amounts, and/or configurations of devices and/or components. Further, although embodiments described herein may include a single device and/or component for a particular function, embodiments in accordance with claimed subject matter may include multiple devices and/or components for the particular function. For example, an electronic switch, such as electronic switch 420, may be implemented with a single NMOS transistor in an embodiment. However, other embodiments may implement an electronic switch, such as 420, using multiple electronic switches, such as multiple transistors, for example. Similarly, although example sense amplifier circuitry is described herein, other embodiments may implement sensing circuitry using other types, amounts, and/or configurations of devices and/or components. The embodiments discussed herein are merely examples, and claimed subject matter is not limited in scope in these respects.

Figure 5:
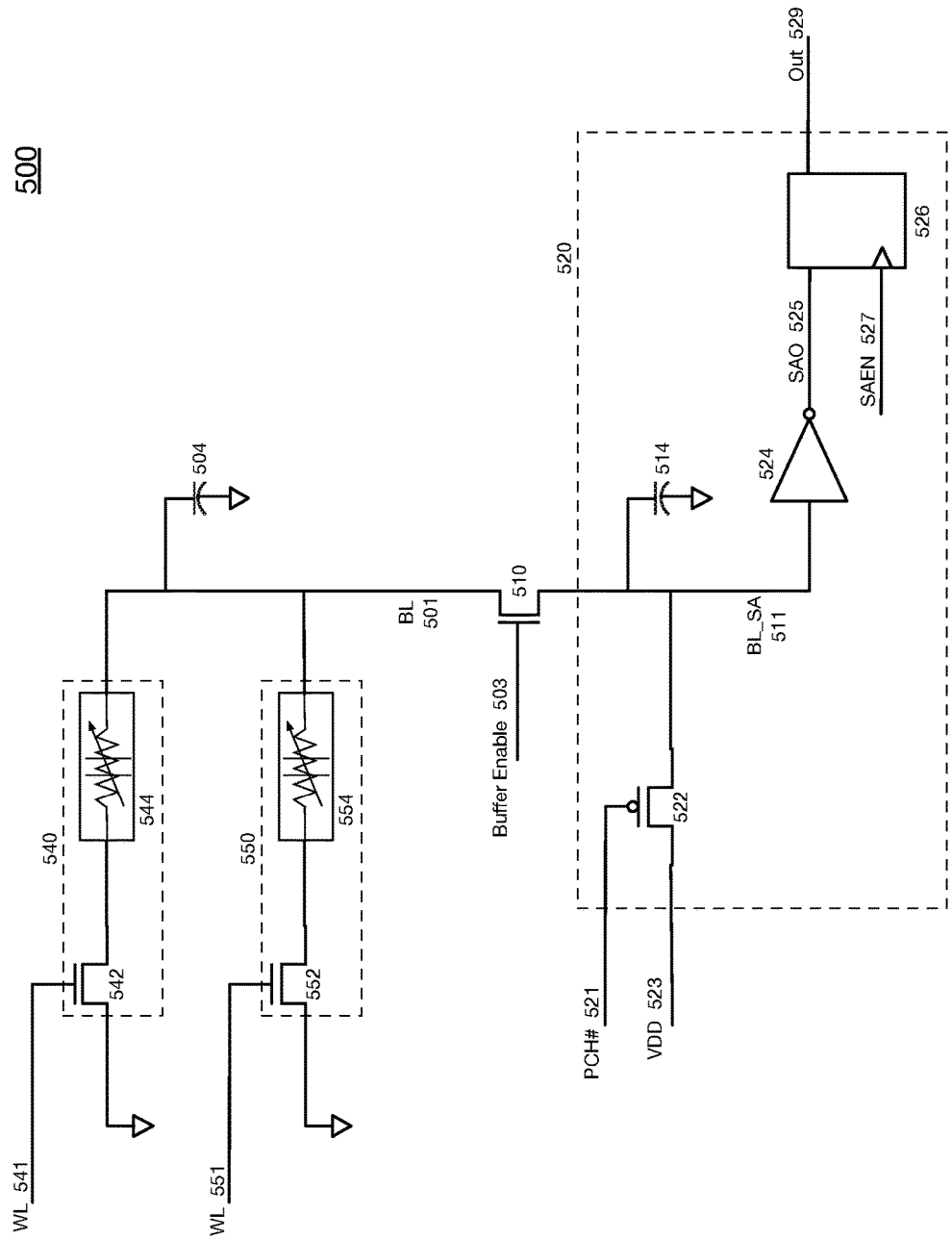
FIG. 5 depicts a schematic block diagram of an example circuit for sensing an impedance state of one or more correlated electron switch elements, in accordance with an embodiment.

FIG. 5 depicts a schematic block diagram of an embodiment 500 of an example circuit for sensing an impedance state of one or more CES elements, such as CES elements 540 and/or 550, in accordance with an embodiment. Although example embodiment 500 depicts and/or describes two CES elements, claimed subject matter is not limited in scope in this respect. For example, embodiments in accordance with claimed subject matter may include larger amounts of CES elements. In an embodiment, sense amplifier circuitry, such as sense amplifier circuitry 520, may comprise an amplifier, such as inverter 524, and/or may comprise a latch, such as latch 526. Also, in an embodiment, a sense amplifier input signal, such as BL_SA 511, may electrically couple sense amplifier circuitry, such as sense amplifier circuitry 520, to a buffer, such as electronic switch 510. In an embodiment, a sense amplifier input signal, such as BL_SA 511, may have a capacitance, such as indicated by capacitor symbol 514 depicted in FIG. 5, at least in part due to circuit design and manufacturing characteristics. Similarly, a bit-line, such as BL 501, may have a capacitance, such as indicated by capacitor symbol 504, at least in part due to circuit design and manufacturing characteristics, for example.

In an embodiment, a sense amplifier input node, such as BL_SA 511, may electrically couple a buffer, such as electronic switch 510, and an amplifier, such as invertor 524. Although embodiments described herein describe use of an inverter as a sense amplifier, such as sense amplifier 524, other embodiments in accordance with claimed subject matter may utilize other circuitry. In an embodiment, such as example embodiment 500, the particular depiction and/or description of sense amplifier circuitry, such as sense amplifier circuitry 520, may comprise a relatively simplified schematic diagram, and claimed subject matter is not limited in scope in these respects. In an embodiment, "sense amplifier" and/or "sense amplifier circuitry" and/or the like represent electronic circuitry that may assert a signal, such as a sense amplifier output signal, at least in part in response to a changing voltage and/or current level on a signal, such as a sense amplifier input signal. For example embodiment 500, a sense amplifier, such as invertor 524, may comprise a component and/or device of sense amplifier circuitry, such as sense amplifier circuitry 520. As discussed more fully blow, a sense amplifier, such as invertor 524, may assert a signal, such as sense amplifier output (SAO) signal 525, at least in part in response to a falling voltage and/or current level on a signal and/or node, such as BL_SA 511, for example. Also, in an embodiment, a signal, such as SAO 525, may be latched and/or sampled by sense amplifier circuitry, such as latch 526 of sense amplifier circuitry 520, and/or by other circuitry. For example, SAO 525 may be sampled and/or latched at least in part in response to a signal, such as sense amplifier enable output enable signal (SAEN) 527, and an output signal, such as Out 529, may be generated, as also discussed more fully below. In an embodiment, a sense amplifier output signal, such as SAO 525, may be sampled and/or latched at least in part in response to a signal, such as SAEN 527, transitioning from a logically high voltage state to a logically low voltage state, for example. Of course, claimed subject matter is not limited in scope in these respects.

As utilized herein, the terms "assert" and/or "asserted" and/or the like in the context of a high-enabled signal (e.g., SAO 525) refer to a logically high voltage level (e.g., binary "1") and "non-asserted" and/or "de-asserted" and/or the like refer to a logically low voltage level (e.g., binary "0"). Similarly, "assert" and/or "asserted" and/or the like in the context of a low-enabled signal (e.g., PCH#521) refer to a logically low voltage level, and "non-asserted" and/or "de-asserted" and/or the like refer to a logically high voltage level. As utilized herein, low-enabled signals may be identified by a character "#" in connection with a signal name. Further, signals in accordance with claimed subject matter may be high-enabled and/or low-enabled. Although various example signals described herein may be identified as either low-enabled or high-enabled, the scope of claimed subject matter is not limited in these respects. For example, although one or more example signals described herein may be identified as low-enabled signals, other embodiments may identify one or more of the example signals as high-enabled signals. Similarly, although one or more example signals described herein may be identified as high-enabled signals, other embodiments may identify one or more of the example signals as low-enabled signals.

In an embodiment, a sense amplifier input signal and/or node, such as BL_SA 511, may be precharged during a precharge period by way of an electronic switch, such as PMOS transistor 522. For example, a precharge signal, such as PCH#521, may enable an electronic switch, such as PMOS transistor 522, when asserted during a precharge period. At least in part in response to the assertion of a precharge signal, such as PCH#521, a supply voltage, such as VDD 523, may be applied to a sense amplifier input signal and/or node, such as BL_SA 511. In an embodiment, a supply voltage, such as VDD 523, may comprise voltage level of approximately 1.2V, for example. Therefore, during a precharge period, a voltage level of approximately 1.2V may be applied to a sense amplifier input signal and/or node, such as BL_SA 511.

During a precharge period, such as when precharge signal PCH#521 is asserted, a relatively higher voltage level, such as 1.2V, may be applied to a sense amplifier input signal and/or node, such as BL_SA 511, as mentioned above. At least in part in response to an assertion of a precharge signal, such as PCH#521, and at least in part in response to a buffer, such as electronic switch 510, being enabled via a signal, such as Buffer_Enable 503, a first relatively intermediate voltage level may be applied to a bit-line, such as BL 501. In an embodiment, a first relatively intermediate voltage level may comprise a voltage level of approximately 0.4V, for example. In an embodiment, a buffer, such as electronic switch 510, may comprise an NMOS transistor. Also, in an embodiment, a gate-source voltage threshold level for NMOS transistor 510 may comprise a voltage level of approximately 100 mV. In an embodiment, NMOS transistor 510 may be oriented in a manner such that a source terminal of NMOS transistor 510 may be coupled to a bit-line, such as BL 501. In an embodiment, a buffer enable signal, such as Buffer_Enable 503, may comprise a second relatively intermediate voltage level, such as approximately 0.5V, for example. In an embodiment, a second relatively intermediate voltage level may comprise a voltage level greater than a first relatively intermediate voltage level, for example.

In an embodiment, with a relatively higher voltage level, such as approximately 1.2V, applied to a sense amplifier input signal and/or node, such as BL_SA 511, with a gate-source voltage threshold level of approximately 100 mV, and/or with a gate voltage level of approximately 0.5V, such as may be applied by Buffer_Enable 503, a bit-line, such as BL 501 may have applied to it a voltage level of approximately 0.4V. For example, if a voltage level for BL 501 falls below 400 mV, a gate-source voltage for NMOS transistor 510 may exceed 100 mV and NMOS transistor 510 may be turned "on" (i.e., relatively higher current level between drain and source). Also, for example, if a voltage level for BL 501 rises above 400 mV, a gate-source voltage for NMOS transistor 510 may fall below 100 mV and NMOS transistor 510 may be turned "off" (i.e., relatively lower current level between drain and source). In this manner, a first intermediate voltage level, such as approximately 0.4V, may be maintained on a bit-line, such as BL 501, and a relatively higher voltage level, such as approximately 1.2V, may be maintained on a sense amplifier input signal and/or node, such as BL_SA 511, during a precharge period, in an embodiment.

In an embodiment, a CES element, such as CES element 540, may comprise a CES device, such as CES device 544, and may also comprise an electronic switch, such as electronic switch 542, for example. Also, in an embodiment, a CES element, such as CES element 550, may comprise a CES device, such as CES device 554, and may also comprise an electronic switch, such as electronic switch 552, for example. Further, in an embodiment, a CES element, such as a CES element 540 and/or 550, may be selected via a word-line, such as WL 541 and/or WL 551. For example, as assertion of a word-line, such as WL 541, may enable an electronic switch, such as electronic switch 542, thereby electrically coupling a CES element, such as CES element 544, to a ground voltage level, in an embodiment. Further, for example, if a word-line, such as WL 551, is not asserted, an electronic switch, such as 552, may not be enabled, and a CES element, such as CES element 554, may not be coupled to a ground voltage level. Thus, for example, an assertion of WL 541 and a non-assertion of WL 551 may result in a selection of CES element 540, such as for a read/sense operation, in an embodiment.

To sense a CES element, such as CES element 540, for example, a precharge signal, such as PCH#521, may be de-asserted. By de-asserting a precharge signal, such as PCH#521, a supply voltage, such as VDD 523, may be disconnected from a sense amplifier input signal and/or node, such as BL_SA 511. At least in part in response to a disconnection of a supply voltage, such as VDD 523, from a sense amplifier input signal and/or node, such as BL_SA 511, the sense amplifier input signal and/or node may begin to discharge to a ground voltage level through a buffer, such as NMOS transistor 510, and/or through a CES element, such as CES element 540. Also, at least in part in response to a disconnection of a supply voltage, such as VDD 523, from a sense amplifier input signal and/or node, such as BL_SA 511, a bit-line, such as BL 501 may begin to discharge through a CES element, such as CES element 540.

In an embodiment, the rates at which a bit-line, such as BL 501, and a sense amplifier input signal and/or node, such as BL_SA 511, may discharge may depend at least in part on an impedance state of a CES element, such as CES element 540. For example, if CES element 540 is programmed to a relatively lower impedance state, BL 501 and/or BL_SA 511 may fall from their respective precharged voltage levels towards a ground voltage level at a relatively quicker rate. Further, for example, if CES element 540 is programmed to a relatively higher impedance state, BL 501 and/or BL_SA 511 may fall from their respective precharged voltage levels towards a ground voltage level at a relatively slower rate. The different rates of discharge for a sense amplifier input signal and/or node, such as BL_SA 511, for different impedance states of a CES element, such as CES element 540, may result in an amplifier, such as invertor 524, asserting a signal indicative of a discharged sense amplifier input signal at different points in time following the end of a precharge period, as explained more fully below, such as in connection with FIG. 7, for example. As also explained more fully below, such as in connection with FIG. 7, for example, an amplifier output signal, such as SAO 525, may be sampled and/or latched by a latch, such as latch 526, and/or by other circuitry to produce an output signal, such as Out 529, at least in part in response to an assertion of a sense amplifier output enable signal, such as SAEN 527. As additionally explained more fully below, such as in connection with FIG. 7, for example, the timing of a sense amplifier output enable signal, such as SAEN 527, may be specified and/or designed, for example, to allow sense amplifier circuitry, such as 520, to differentiate between different discharge rates for a sense amplifier input signal and/or node, such as BL_SA 511, associated with the different impedance states for a CES element, such as CES element 540 and/or 550.

Figure 6:
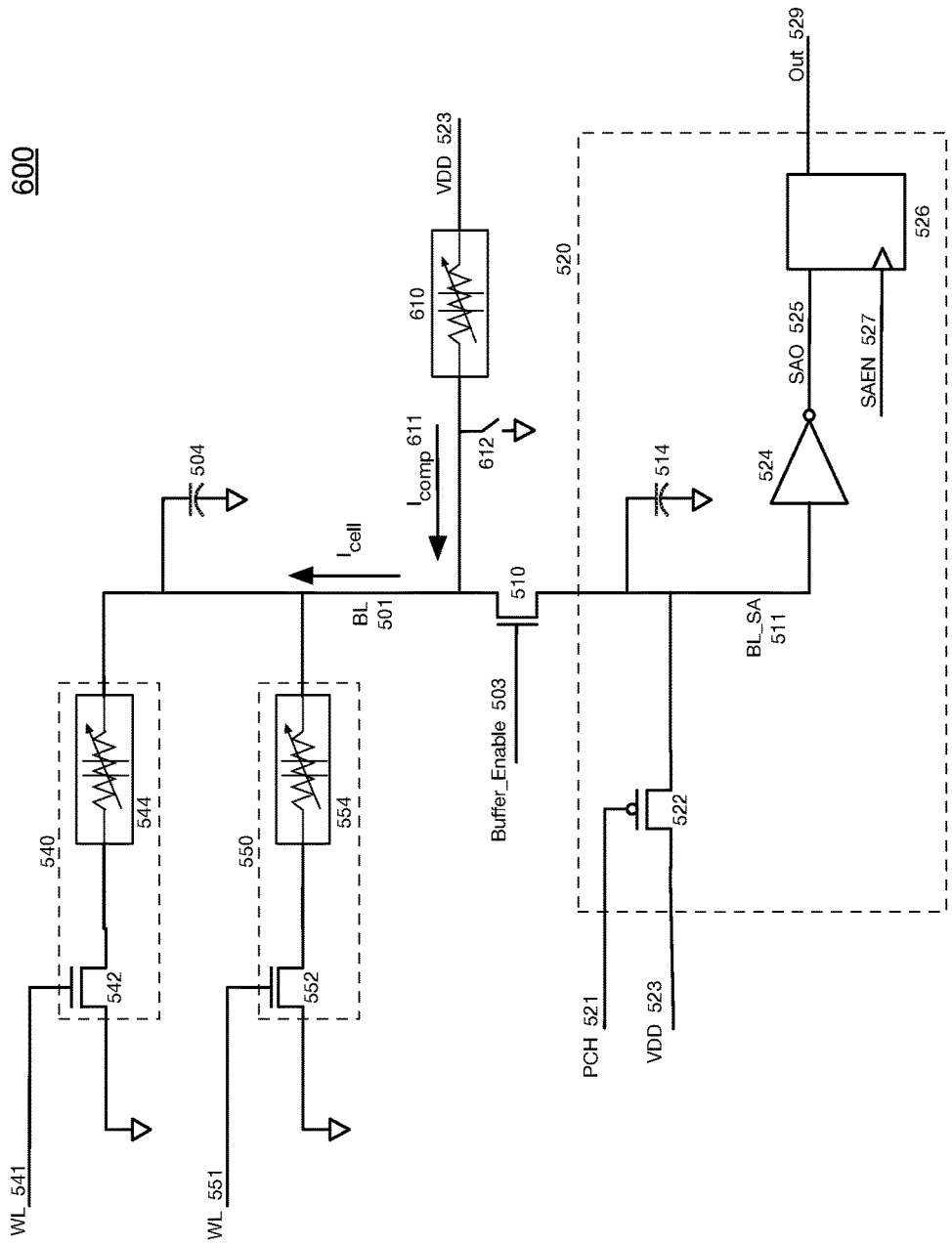
FIG. 6 is a schematic diagram depicting an example circuit for sensing an impedance state of one or more correlated electron switch elements, in accordance with an embodiment.

FIG. 6 is a schematic diagram depicting an embodiment 600 of example circuit for sensing an impedance state of one or more CES elements, such as CES elements 540 and/or 550, in accordance with an embodiment. Example embodiment 600 may comprise many similar features to that of example embodiment 500, discussed above. In an embodiment, a compensation current, such as $I_{comp}$ 611, may be injected onto a bit-line, such as BL 501, to compensate at least in part for leakage current through a CES element, such as CES element 540 and/or 550. For example, by providing a compensation current, such as $I_{comp}$ 611, a bit-line, such as BL 501, may not discharge as quickly and/or may not discharge at all for a situation in which a CES element programmed to a relatively higher impedance state is being sensed. By reducing or eliminating a rate of discharge for a bit-line, such as BL 501, in the case of a higher impedance state CES element, an amplifier, such as invertor 524, may delay or eliminate assertion of a signal, such as SAO 525, indicating discharge of a sense amplifier input signal and/or node, such as BL_SA 511. As explained more fully below, such as in connection with FIG. 7, for example, a compensation current may allow for relatively more robust sense amplifier circuitry due at least in part to relatively more relaxed timing parameters for a sense amplifier output enable signal, such as SAEN 527.

In an embodiment, a compensation current, such as $I_{comp}$ 611, may be injected onto a bit-line, such as BL 501, at least in part by electrically coupling a CES device, such as CES device 610, between a supply voltage, such as VDD 523, and a bit-line, such as BL 501. In an embodiment, a CES device, such as CES device 610, may be designed to be similar to CES devices, such as 544 and/or 554, implemented as part of CES elements 540 and/or 550. In this manner, a compensation current, such as $I_{comp}$ 611, may approximately match current flow through CES elements, such as CES elements 540 and/or 550, programmed to a relatively higher impedance state. In an embodiment, a CES device, such as CES device 610, may be initially programmed to a relatively higher impedance state by closing a switch, such as switch 612, thereby coupling CES device 610 to ground and also thereby applying a supply voltage level, such as 1.2V of VDD 523, for example, across a CES device, such as CES device 610. In an embodiment, a switch, such as switch 612, may be opened at least in part in response to a programming of a CES device, such as CES device 610, to a relatively higher impedance state. Thus, for normal operation, a CES device, such as CES device 610, may be electrically coupled in its relatively higher impedance state between a supply voltage, such as VDD 523, and a bit-line, such as BL 501.

Although example embodiment 600 is described as utilizing a CES device, such as CES device 610, to provide a compensation current, claimed subject matter is not limited in scope in these respects. For example, other embodiments may incorporate one or more transistors, such as one or more PMOS and/or NMOS transistors, to generate and/or inject a compensation current to a bit-line, such as BL 501.

Figure 7:
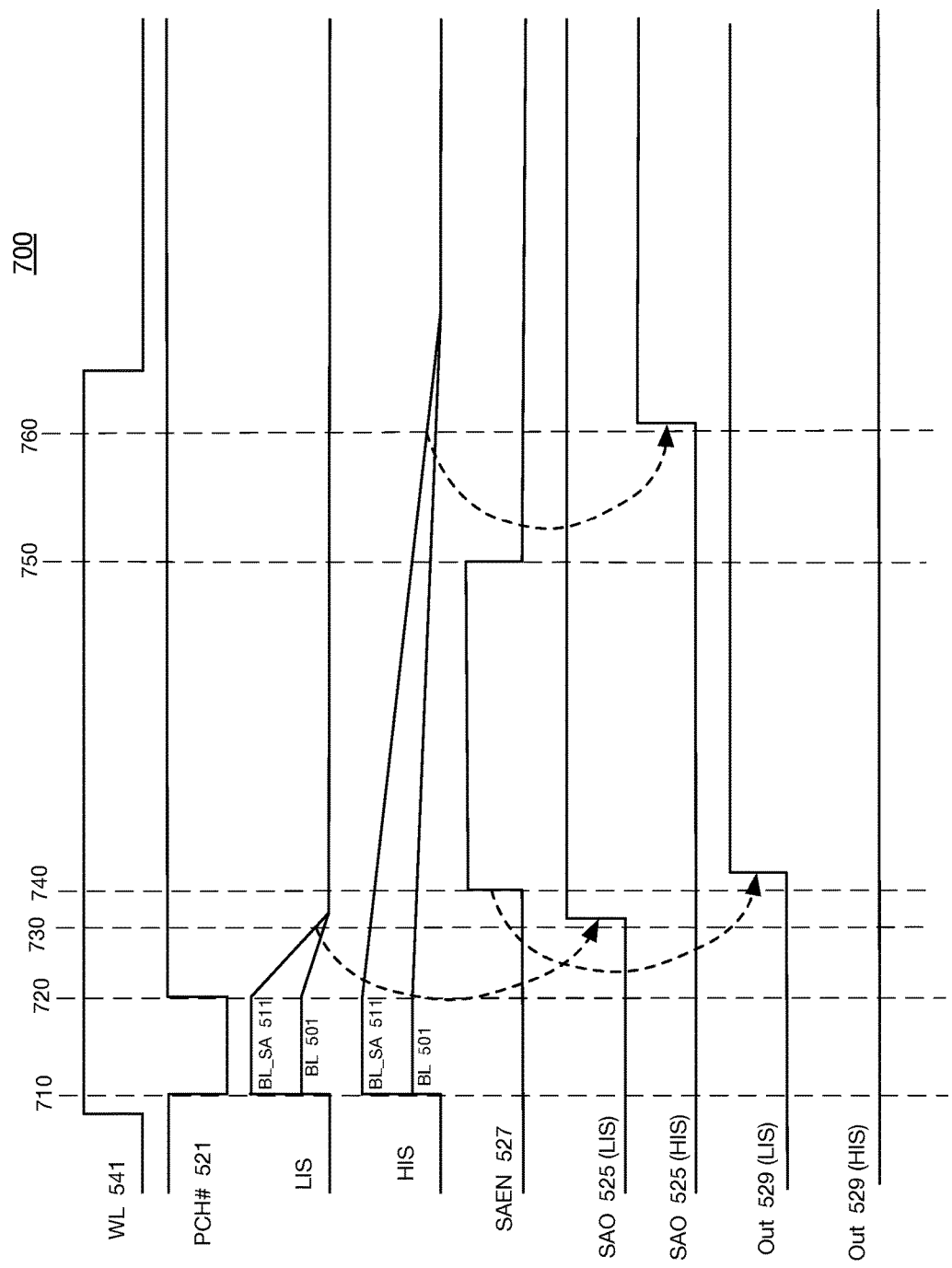
FIG. 7 is a simplified timing diagram depicting an example correlated electron switch element impedance state sensing operation, in accordance with an embodiment.

FIG. 7 is a simplified timing diagram 700 depicting an example CES element impedance state sensing operation, in accordance with an embodiment. In an embodiment, simplified timing diagram 700 may depict example relative and/or approximate timings for various signals related to example embodiments 500 and/or 600, discussed above. Of course, the relative and/or approximate timings and/or relationships among signals depicted in timing diagram 700 are merely examples, and claimed subject matter is not limited in scope in these respects.

In an embodiment, approximately at example point in time 710, a word-line signal, such as WL 541, may comprise an asserted state, for example. Also, approximately at example point in time 710, a sense amplifier output enable signal, such as SAEN 527, may be de-asserted, a sense amplifier output signal, such as SAO 525, may be de-asserted, and an output signal, such as Out 529, may also be de-asserted. Further, approximately at example point in time 710, a precharge signal, such as PCH#521, may become asserted. Also, approximately at example point in time 710, a bit-line signal, such as BL 501, may be precharged to a first relatively intermediate voltage level, such as approximately 0.4V, and a sense amplifier input signal and/or node, such as BL_SA 511, may be precharged to a relatively higher voltage level, such as approximately 1.2V, in an embodiment.

At approximately example point in time 720, a precharge signal, such as PCH#521, may become de-asserted. At least in part in response to a de-assertion of a precharge signal, such as PCH#521, voltages applied to a bit-line, such as BL 501, and/or to a sense amplifier input signal and/or node, such as BL_SA 511, may be disconnected, and a bit-line, such as BL 501, and/or to a sense amplifier input signal and/or node, such as BL_SA 511, may begin to discharge. For example, BL 501 may begin to discharge through CES device 544 and electronic switch 542 to a ground voltage level at least in part due to the assertion of WL 541. Similarly, BL_SA 511 may begin to discharge to a ground voltage level through electronic switch 510, CES device 544, and electronic switch 542, in an embodiment. In the case of a CES element, such as 540, being programmed to a relatively lower impedance state (LIS), BL_SA 511 and/or BL 501 may discharge at a relatively quicker rate. In the case of a CES element, such as 540, being programmed to a relatively higher impedance state (HIS), BL_SA 511 and/or BL 501 may discharge at a relatively slower rate.

For a situation in which BL_SA 511 and/or BL 501 discharge at a relatively quicker rate, a sense amplifier, such as invertor 524, may detect, such as approximately at example point in time 730, that a sense amplifier input signal, such as BL_SA 511, has fallen to or below a threshold voltage and/or current level. In an embodiment, at least in part in response to a detection that a sense amplifier input signal and/or node, such as BL_SA 511, has fallen to and/or below a threshold voltage and/or current level a sense amplifier, such as invertor 524, may assert a sense amplifier output signal, such as SAO 525.

Further, at approximately example point in time 740, a sense amplifier output enable signal, such as SAEN 527, may be asserted, for example. In an embodiment, at least in part in response to an assertion of a sense amplifier output enable signal, such as SAEN 527, the asserted state of a sense amplifier output signal, such as SAO 525, may be reflected in an output signal, such as Out 529. For a situation in which BL_SA 511 and/or BL 501 discharge at a relatively quicker rate, such as due at least in part to a relatively lower impedance state for CES element 540, for example, a sense amplifier output signal, such as SAO 525, may be asserted approximately at example point in time 740. At least in part in response to an assertion of a sense amplifier output enable signal, such as SAEN 527, and at least in part in response to an asserted state of a sense amplifier output signal, such as SAO 525, an output signal, such as Out 529, may become asserted, for example. Further, for a situation in which BL_SA 511 and/or BL 501 discharge at a relatively slower rate, such as due at least in part to a relatively higher impedance state for CES element 540, for example, a sense amplifier output signal, such as SAO 525, may be not be asserted approximately at example point in time 740. At least in part in response to a de-asserted state of a sense amplifier output signal, such as SAO 525, an output signal, such as Out 529, may remain de-asserted, for example. Additionally, in an embodiment, a sense amplifier output enable signal, such as SAEN 527, may be de-asserted, such as approximately at example point in time 750. In an embodiment, at least in part in response to a de-assertion of a sense amplifier output enable signal, such as SAEN 527, a latch, such as latch 526, and/or other circuitry may sample and/or latch an output signal, such as Out 529, to maintain the output signal's logical state at least until another assertion of a sense amplifier output enable signal, such as SAEN 527, during another CES element sensing operation, for example.

Also, for a situation in which BL_SA 511 and/or BL 501 discharge at a relatively slower rate, such as due at least in part to a relatively higher impedance state for CES element 540, for example, a sense amplifier, such as invertor 524, may detect, such as approximately at example point in time 760, that a sense amplifier input signal, such as BL_SA 511, has fallen to and/or below a threshold voltage and/or current level. At least in part in response to a detection that a sense amplifier input signal, such as BL_SA 511, has fallen to and/or below a threshold voltage and/or current level, a sense amplifier output signal, such as SAO 525, may become asserted. However, at least in part due to a sense amplifier output enable signal, such as SAEN 527 becoming de-asserted approximately at example point in time 750, an output signal, such as Out 529, may not change state approximately at example point in time 760. It may be noted that, in an embodiment, a sense amplifier circuitry output signal, such as Out 529, may be sampled and/or latched at a point in time when the output signal may have already become asserted in cases of a quicker-discharging sense amplifier input signal and may not have become asserted in cases of a relatively slower-discharging sense amplifier input signal. In this manner, an impedance state for one or more CES elements may be detected. For the example depicted in timing diagram 700, sense amplifier circuitry output signal Out 529 may be sampled and/or latched approximately at a point in time 750, and point in time 750 may comprise a point in time between point in time 730 when BL_SA 511 may be detected to be discharged in the case of a relatively lower impedance state for CES element 540 and point in time 760 when BL_SA 511 may be detected to be discharged in the case of a relatively higher impedance state for CES element 540.

Thus, in an embodiment, for a situation wherein a CES element, such as CES element 540, may be programmed to a relatively lower impedance state, an output signal, such as Out 529, may be latched in an asserted state. Further, in an embodiment, for a situation wherein a CES element, such as CES element 540, may be programmed to a relatively higher impedance state, an output signal, such as Out 529, may remain in a de-asserted state. In this manner, an impedance state for one or more CES elements may be sensed and/or detected, for example.

As mentioned above, a compensation current, such as $I_{comp}$ 611, may be injected onto a bit-line, such as BL 501, to compensate at least in part for leakage current through a CES element, such as CES element 540 and/or 550. For example, by providing a compensation current, such as $I_{comp}$ 611, a bit-line, such as BL 501, may not discharge as quickly and/or may not discharge at all for a situation in which a CES element programmed to a relatively higher impedance state is being sensed. Thus, for a situation wherein a CES element, such as CES element 540, is programmed to a relatively higher impedance state, a sense amplifier, such as invertor 524, may not detect a discharge of an input signal, such as BL_SA 511. Further, for such a situation, a sense amplifier, such as invertor 524, may not assert an output signal, such as SAO 525. Therefore, in an embodiment, a compensation current, such as $I_{comp}$ 611, may allow for relatively more robust sense amplifier circuitry due at least in part to relatively more relaxed timing parameters related to latching and/or sampling a sense amplifier output signal, such as SAO 525. In other words, a window of time during which an output signal, such as SAO 525, may be validly sampled and/or latched, for example, may be extended through the use of a compensation current, such as $I_{comp}$ 611. Of course, claimed subject matter is not limited in scope in these respects.

Figure 8:
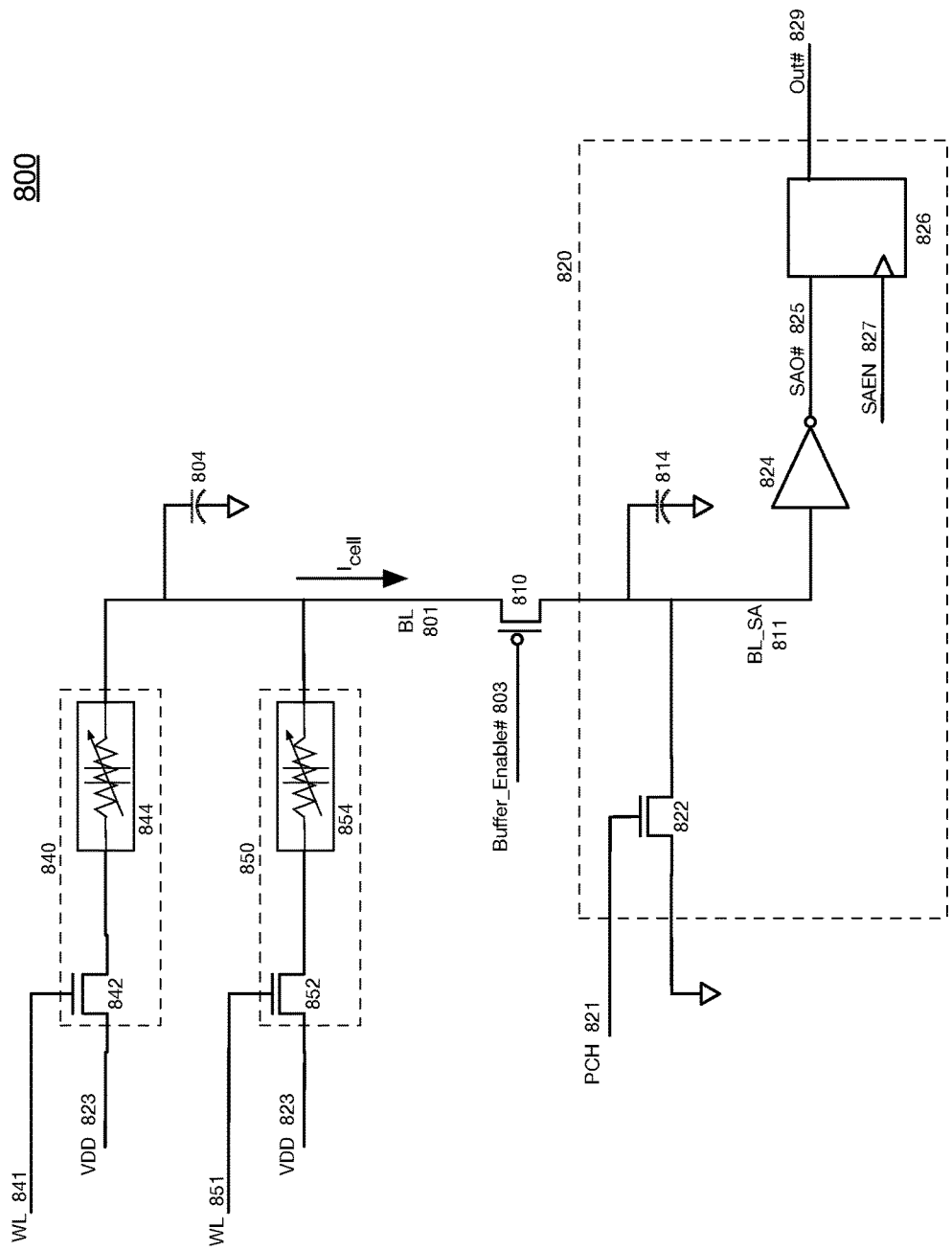
FIG. 8 is a schematic diagram depicting an example circuit for sensing an impedance state of one or more correlated electron switch elements, in accordance with an embodiment.

FIG. 8 is a schematic diagram depicting an embodiment 800 of an example circuit for sensing an impedance state of one or more CES elements, such as CES elements 840 and/or 850, in accordance with an embodiment. Example embodiment 800 may comprise several similar features to that of example embodiments 500 and/or 600, discussed above. However, example embodiment 800 may distinguish from example embodiments 500 and/or 600 at least in that current flow through CES devices, such as CES devices 844 and/or 854, a bit-line, such as BL 801, and/or a buffer, such as electronic switch 810, may be in a reverse direction as compared with current flow through BL 501 and/or CES devices 544 and/or 554, for example, as explained more fully below. In an embodiment, by periodically and/or occasionally reversing current flow through a circuit, CES element and/or sense amplifier circuitry, device and/or component degradation may be reduced and/or a useful life of such circuitry may be increased, for example.

Although example embodiment 800 depicts and/or describes two CES elements, embodiments in accordance with claimed subject matter may include different and/or larger amounts of CES elements. In an embodiment, one or more CES elements, such as CES elements 840 and/or 850, may comprise one or more CES devices, such as CES device 844 and/or CES device 854, for example. Further, in an embodiment, one or more CES elements, such as CES elements 840 and/or 850, may include one or more electronic switches, such as NMOS transistors 842 and/or 852, for example. Further, in an embodiment, capacitor symbol 814 may represent a capacitance present on BL_SA 811 due at least in part to circuit design and/or manufacturing characteristics. Similarly, capacitor symbol 804 may a capacitance on BL 801 due at least in part to circuit design and/or manufacturing characteristics, for example.

In an embodiment, sense amplifier circuitry, such as sense amplifier circuitry 820, may comprise an amplifier, such as inverter 824, and/or may comprise a latch, such as latch 826. Also, in an embodiment, a sense amplifier input signal and/or node, such as BL_SA 811, may electrically couple sense amplifier circuitry, such as sense amplifier circuitry 820, to a buffer, such as electronic switch 810. In an embodiment, a sense amplifier input signal and/or node, such as BL_SA 811, may electrically couple a buffer, such as electronic switch 810, and a sense amplifier, such as invertor 824. Although embodiments described herein describe use of an inverter as a sense amplifier, such as sense amplifier 824, other embodiments in accordance with claimed subject matter may utilize other circuitry. In an embodiment, such as example embodiment 800, the particular depiction and/or description of sense amplifier circuitry, such as sense amplifier circuitry 820, may comprise a relatively simplified schematic diagram, and claimed subject matter is not limited in scope in these respects.

Figure 9:
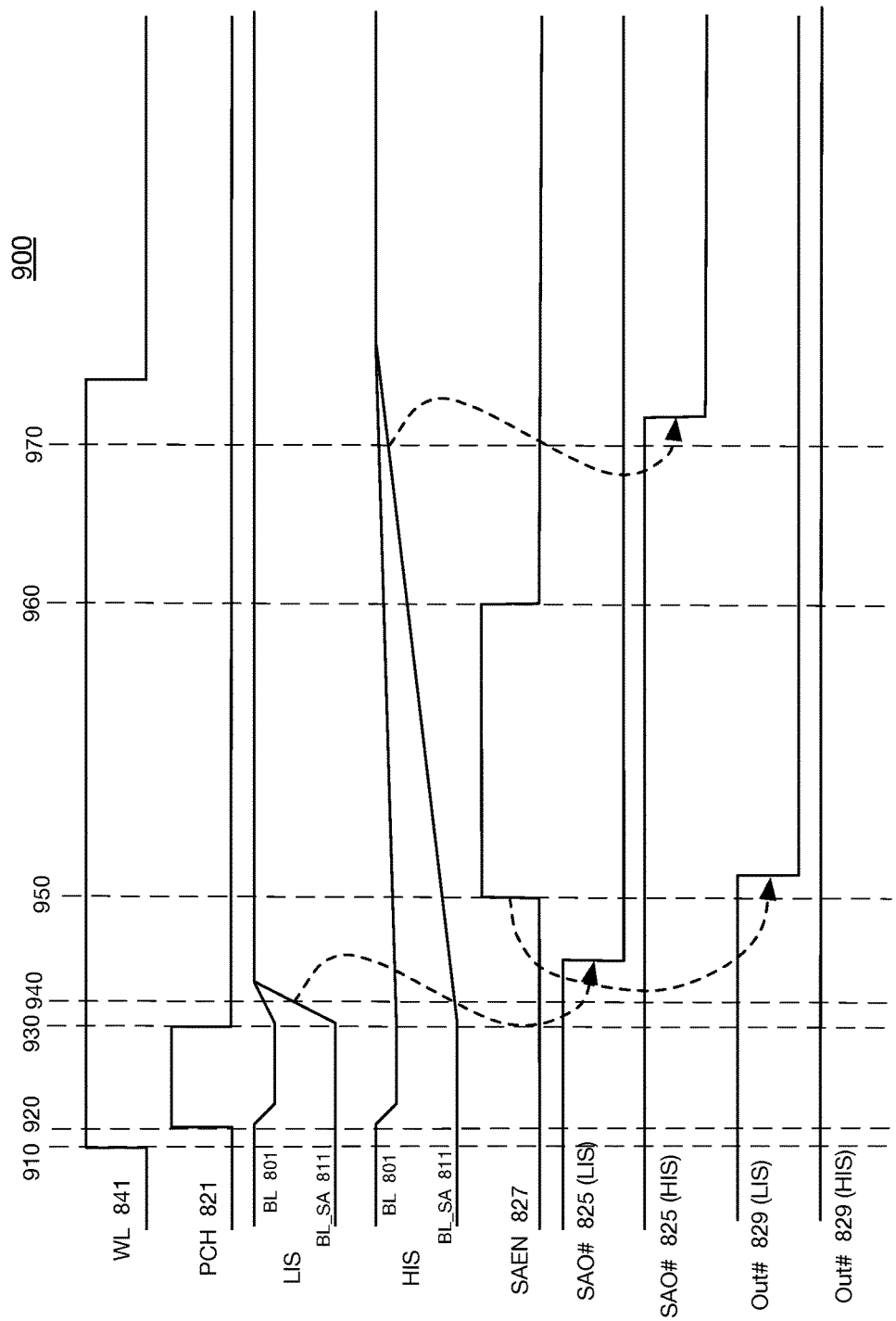
FIG. 9 depicts a simplified timing diagram depicting an example correlated electron switch element impedance state sensing operation, in accordance with an embodiment.

FIG. 9 depicts a simplified timing diagram 900 depicting an example CES element impedance state sensing operation, in accordance with an embodiment. In an embodiment, a sense amplifier input signal and/or node, such as BL_SA 811, may be initially discharged to a ground voltage level and/or a bit-line, such as BL 801, may initially be precharged to a relatively higher voltage level, such as approximately 1.2 V. In an embodiment, a word-line, such as WL 841, for example, may be asserted approximately at example point in time 910. In an embodiment, with an assertion of a word-line, such as WL 841, there may exist a voltage drop of approximately 0V across a CES device, such as CES device 844, at least in part due to a supply voltage, such as VDD 823, and a bit-line, such as BL 801, being charged to a relatively higher voltage level, such as approximately 1.2V.

Further, in an embodiment, a precharge signal, such as PCH 821, may be asserted approximately at example point in time 920. Also, in an embodiment, an electronic switch, such as PMOS 810, may be enabled via a buffer enable signal, such as Buffer_Enable#803. At approximately example point in time 920, a bit-line, such as BL 801, may drop in voltage level to approximately 0.8V, for example, at least in part due to a resistive divider formed by a CES device, such as CES device 844, and an electronic switch, such as PMOS transistor 810, in an embodiment.

Additionally, in an embodiment, a precharge signal, such as PCH 821, may be de-asserted approximately at example point in time 930. At least in part in response to a de-assertion of a precharge signal, such as PCH 821, an electronic switch, such as NMOS transistor 822, may become disabled and/or a sense amplifier input signal and/or node, such as BL_SA 811, may no longer be electrically coupled to ground, in an embodiment. Further, in an embodiment, at least in part in response to no longer being electrically coupled to ground, a sense amplifier input signal and/or node, such as BL_SA 811, may begin to rise in voltage and/or current level. In an embodiment, for situations in which a CES element, such as CES element 840, is programmed to a relatively lower impedance state (LIS), a sense amplifier input signal and/or node, such as BL_SA 811, may rise relatively quickly at least in part in response to a de-assertion of a precharge signal, such as PCH 821. Additionally, in an embodiment, for situations in which a CES element, such as CES element 840, is programmed to a relatively higher impedance state (HIS), a sense amplifier input signal and/or node, such as BL_SA 811, may rise relatively slowly at least in part in response to a de-assertion of a precharge signal, such as PCH 821.

In an embodiment, for a situation in which a sense amplifier input signal and/or node, such as BL_SA 811, rises relatively quickly, a sense amplifier, such as invertor 824, may detect the rise in voltage and/or current approximately at example point in time 940 and may assert an output signal, such as SAO#825. Further, for a situation in which a sense amplifier input signal and/or node, such as BL_SA 811, rises relatively slowly, a sense amplifier, such as invertor 824, may detect the rise in voltage and/or current approximately at example point in time 970 and may assert an output signal, such as SAO#825.

Additionally, in an embodiment, a sense amplifier output enable signal, such as SAEN 827, may be asserted approximately at example point in time 950. At least in part in response to an assertion of a sense amplifier output enable signal, such as SAEN 827, a logical voltage level present on a sense amplifier output signal, such as SAO#825, may be reflected on a sense amplifier circuitry output signal, such as Out#829. For example, for a situation in which a sense amplifier input signal and/or node, such as BL_SA 811, rises relatively quickly (i.e., CES element LIS), a sense amplifier output signal, such as SAO#825, may be in an asserted state at example point in time 950, and an output signal, such as Out#829 may transition to an asserted state. Further, for a situation in which a sense amplifier input signal and/or node, such as BL_SA 811, rises relatively slowly (i.e., CES element HIS), a sense amplifier output signal, such as SAO#825, may be in a de-asserted state at example point in time 950, and an output signal, such as Out#829 may remain in a de-asserted state, for example.

In an embodiment, a sense amplifier output enable signal, such as SAEN 827, may transition to a de-asserted state approximately at example point in time 960. In an embodiment, a transition from an asserted state to a de-asserted state (e.g., falling edge of signal) may indicate to an output circuit, such as latch 826, to sample and/or latch an output signal, such as Out#829, such that the output signal may remain in its current state at least until another assertion of a sense amplifier output enable signal, such as SAEN 827. In an embodiment, a sense amplifier circuitry output signal, such as Out#829, may be sampled and/or latched at a point in time, such as example point in time 960, when the output signal may have already become asserted in cases of a quicker-rising sense amplifier input signal and/or node due at least in part to CES element relatively lower impedance state and may not yet have become asserted in cases of a relatively slower-rising sense amplifier input signal and/or node due at least in part to CES element relatively higher impedance state, for example. In this manner, an impedance state for one or more CES elements, such as CES element 840 and/or CES element 850, may be detected. For the example depicted in timing diagram 900, sense amplifier circuitry output signal Out#829 may be sampled and/or latched approximately at example point in time 950, and example point in time 950 may comprise a point in time between point in time 940 when BL_SA 811 may be detected to have risen in the case of CES element 540 relatively lower impedance state and point in time 970 when BL_SA 811 may be detected to have risen in the case of CES element 840 relatively higher impedance state, in an embodiment.

Thus, in an embodiment, for a situation wherein a CES element, such as CES element 840, may be programmed to a relatively lower impedance state, an output signal, such as Out#829, may be latched in an asserted state. Further, in an embodiment, for a situation wherein a CES element, such as CES element 840, may be programmed to a relatively higher impedance state, an output signal, such as Out#529, may remain in a de-asserted state. In this manner, an impedance state for one or more CES elements may be sensed and/or detected, for example.

Figure 10:
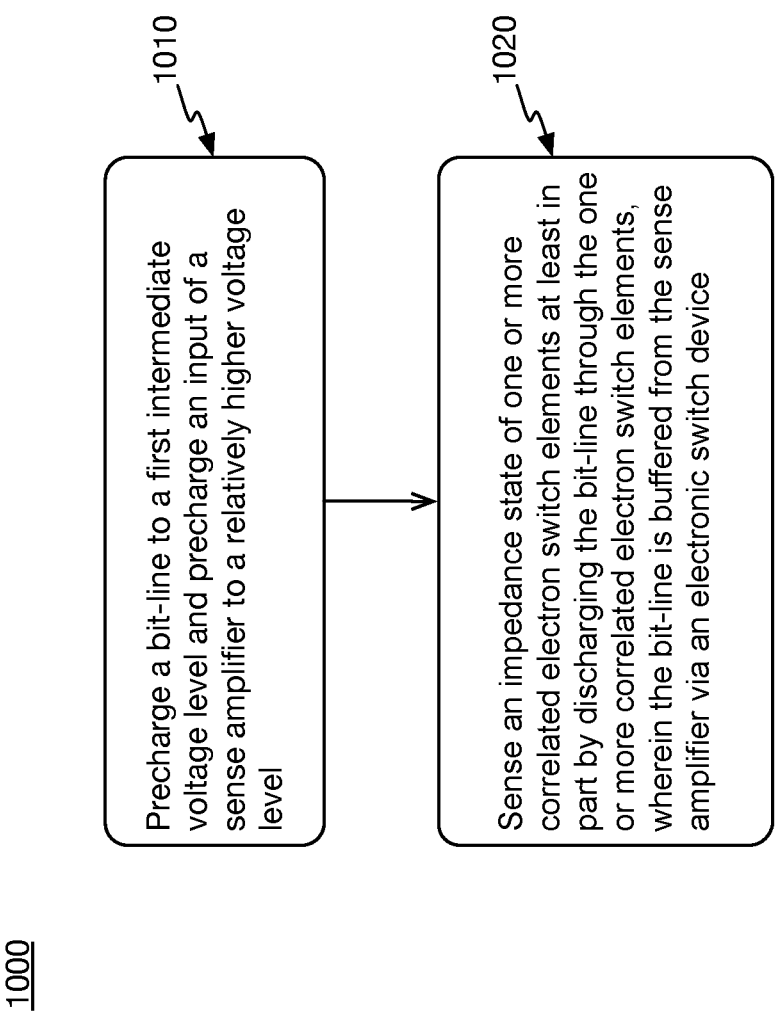
FIG. 10 depicts a simplified flowchart for an example process for sensing an impedance state of one or more correlated electron switch elements, in accordance with an embodiment.

FIG. 10 depicts a simplified flowchart for an example process 1000 for sensing an impedance state of one or more CES elements, in accordance with an embodiment. Embodiments in accordance with claimed subject matter may include all of blocks 1010-1020, may include less than blocks 1010-1020, or may include more than blocks 1010-1020. Further, the order of blocks 1010-1020 is merely an example order, and claimed subject matter is not limited in scope in this respect.

At block 1010, a bit-line may be precharged to a first intermediate voltage level, in an embodiment. Also, in an embodiment, an input signal and/or node of a sense amplifier may be precharged to a relatively higher voltage level. At block 1020, an impedance state of one or more CES elements may be sensed at least in part by discharging the bit-line through the one or more CES elements, wherein the bit-line is buffered from the sense amplifier via an electronic switch device.

In an embodiment, the first relatively intermediate voltage level may comprise a magnitude of approximately 0.4V and the relatively higher voltage level may comprise a magnitude of approximately 1.2V. Also, in an embodiment, the electronic switch device may be enabled via a second relatively intermediate voltage level. For example, the second relatively intermediate voltage level may comprise a magnitude of approximately 0.5V.

At least in part in response to a de-assertion of a precharge signal, an output signal of the sense amplifier may transition to an asserted state at a first point in time at least in part in response to the impedance state of the one or more CES elements comprising a relatively lower impedance state, in an embodiment. Also, in an embodiment, at least in part in response to the de-assertion of the precharge signal, the output signal of the sense amplifier may transition to the asserted state at a second point in time at least in part in response to the impedance state of the one or more CES elements comprising a relatively higher impedance state. In an embodiment, sensing the impedance state of the one or more CES elements may further include latching the output signal of the sense amplifier during a period of time between the first point in time and the second point in time.

In another embodiment, a first bit-line segment electrically coupled to one or more CES elements may be precharged to a first relatively intermediate voltage level and a second bit-line segment electrically coupled to sense amplifier circuitry may be precharged to a relatively higher voltage level, wherein the first bit-line segment may be buffered from the second bit-line segment via an electronic switch device. Further, in an embodiment, the electronic switch device may be enabled via a second relatively intermediate voltage level, wherein the second relatively intermediate voltage level is greater than the first relatively intermediate voltage level and less than the relatively higher voltage level.

Additionally, at least in part in response to a de-assertion of a precharge signal, an output signal of the sense amplifier circuitry may transition to an asserted state at a first point in time at least in part in response to an impedance state of a particular CES element of the one or more CES elements comprising a relatively lower impedance state, in an embodiment. Also, in an embodiment, the output signal of the sense amplifier circuitry may transition to the asserted state at a second point in time at least in part in response to the impedance state of the particular CES element of the one or more CES elements comprising a relatively higher impedance state. In an embodiment, the output signal of the sense amplifier circuitry may be latched during a period of time between the first point in time and the second point in time.

In the context of the present disclosure, the term "connection," the term "component" and/or similar terms are intended to be physical, but are not necessarily always tangible. Whether or not these terms refer to tangible subject matter, thus, may vary in a particular context of usage. As an example, a tangible connection and/or tangible connection path may be made, such as by a tangible, electrical connection, such as an electrically conductive path comprising metal or other electrical conductor, that is able to conduct electrical current between two tangible components. Likewise, a tangible connection path may be at least partially affected and/or controlled, such that, as is typical, a tangible connection path may be open or closed, at times resulting from influence of one or more externally derived signals, such as external currents and/or voltages, such as for an electrical switch. Non-limiting illustrations of an electrical switch include a transistor, a diode, etc. However, a "connection" and/or "component," in a particular context of usage, likewise, although physical, can also be non-tangible, such as a connection between a client and a server over a network, which generally refers to the ability for the client and server to transmit, receive, and/or exchange communications.

In a particular context of usage, such as a particular context in which tangible components are being discussed, therefore, the terms "coupled" and "connected" are used in a manner so that the terms are not synonymous. Similar terms may also be used in a manner in which a similar intention is exhibited. Thus, "connected" is used to indicate that two or more tangible components and/or the like, for example, are tangibly in direct physical contact. Thus, using the previous example, two tangible components that are electrically connected are physically connected via a tangible electrical connection, as previously discussed. However, "coupled," is used to mean that potentially two or more tangible components are tangibly in direct physical contact. Nonetheless, is also used to mean that two or more tangible components and/or the like are not necessarily tangibly in direct physical contact, but are able to co-operate, liaise, and/or interact, such as, for example, by being "optically coupled." Likewise, the term "coupled" may be understood to mean indirectly connected in an appropriate context. It is further noted, in the context of the present disclosure, the term physical if used in relation to memory, such as memory components or memory states, as examples, necessarily implies that memory, such memory components and/or memory states, continuing with the example, is tangible.

Unless otherwise indicated, in the context of the present disclosure, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Furthermore, the terms "first," "second'" "third," and the like are used to distinguish different aspects, such as different components, as one example, rather than supplying a numerical limit or suggesting a particular order, unless expressly indicated otherwise. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques, even if those reasonable alternative techniques do not provide identical values, identical measurements or identical results, unless otherwise expressly indicated.

It is further noted that the terms "type" and/or "like," if used, such as with a feature, structure, characteristic, and/or the like, using "optical" or "electrical" as simple examples, means at least partially of and/or relating to the feature, structure, characteristic, and/or the like in such a way that presence of minor variations, even variations that might otherwise not be considered fully consistent with the feature, structure, characteristic, and/or the like, do not in general prevent the feature, structure, characteristic, and/or the like from being of a "type" and/or being "like," (such as being an "optical-type" or being "optical-like," for example) if the minor variations are sufficiently minor so that the feature, structure, characteristic, and/or the like would still be considered to be predominantly present with such variations also present. Thus, continuing with this example, the terms optical-type and/or optical-like properties are necessarily intended to include optical properties. Likewise, the terms electrical-type and/or electrical-like properties, as another example, are necessarily intended to include electrical properties. It should be noted that the specification of the present disclosure merely provides one or more illustrative examples and claimed subject matter is intended to not be limited to one or more illustrative examples; however, again, as has always been the case with respect to the specification of a patent application, particular context of description and/or usage provides helpful guidance regarding reasonable inferences to be drawn.

Algorithmic descriptions and/or symbolic representations are examples of techniques used by those of ordinary skill in the signal processing and/or related arts to convey the substance of their work to others skilled in the art. An algorithm is, in the context of the present disclosure, and generally, is considered to be a self-consistent sequence of operations and/or similar signal processing leading to a desired result. In the context of the present disclosure, operations and/or processing involve physical manipulation of physical quantities. Typically, although not necessarily, such quantities may take the form of electrical and/or magnetic signals and/or states capable of being stored, transferred, combined, compared, processed and/or otherwise manipulated, for example, as electronic signals and/or states making up components of various forms of digital content, such as signal measurements, text, images, video, audio, etc.

It has proven convenient at times, principally for reasons of common usage, to refer to such physical signals and/or physical states as bits, values, elements, parameters, symbols, characters, terms, numbers, numerals, measurements, content and/or the like. It should be understood, however, that all of these and/or similar terms are to be associated with appropriate physical quantities and are merely convenient labels. Unless specifically stated otherwise, as apparent from the preceding discussion, it is appreciated that throughout this specification discussions utilizing terms such as "processing," "computing," "calculating," "determining", "establishing", "obtaining", "identifying", "selecting", "generating", and/or the like may refer to actions and/or processes of a specific apparatus, such as a special purpose computer and/or a similar special purpose computing and/or network device. In the context of this specification, therefore, a special purpose computer and/or a similar special purpose computing and/or network device is capable of processing, manipulating and/or transforming signals and/or states, typically in the form of physical electronic and/or magnetic quantities, within memories, registers, and/or other storage devices, processing devices, and/or display devices of the special purpose computer and/or similar special purpose computing and/or network device. In the context of this particular disclosure, as mentioned, the term "specific apparatus" therefore includes a general purpose computing and/or network device, such as a general purpose computer, once it is programmed to perform particular functions, such as pursuant to program software instructions.

In some circumstances, operation of a memory device, such as a change in state from a binary one to a binary zero or vice-versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation and/or storage of charge or a release of stored charge. Likewise, in other memory devices, a change of state may comprise a physical change, such as a transformation in magnetic orientation. Likewise, a physical change may comprise a transformation in molecular structure, such as from crystalline form to amorphous form or vice-versa. In still other memory devices, a change in physical state may involve quantum mechanical phenomena, such as, superposition, entanglement, and/or the like, which may involve quantum bits (qubits), for example. The foregoing is not intended to be an exhaustive list of all examples in which a change in state from a binary one to a binary zero or vice-versa in a memory device may comprise a transformation, such as a physical, but non-transitory, transformation. Rather, the foregoing is intended as illustrative examples.

In the preceding description, various aspects of claimed subject matter have been described. For purposes of explanation, specifics, such as amounts, systems and/or configurations, as examples, were set forth. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all modifications and/or changes as fall within claimed subject matter.

What is claimed is:

1. A method, comprising:
   precharging a bit-line coupled to one or more correlated electron switch elements to a first voltage level and precharging a sense amplifier input node to a second voltage level, wherein the second voltage level is greater than the first voltage level, wherein the bit-line is buffered from the sense amplifier input node via an electronic switch circuit, and wherein the first voltage level is limited to a particular level to prevent spurious reset conditions for the one or more correlated electron switch elements during sensing operations; and
   sensing an impedance state of one or more correlated electron switch elements at least in part by discharging the bit-line through the one or more correlated electron switch elements.

2. The method of claim 1, wherein the electronic switch circuit comprises a transistor including a source terminal and a drain and further including a gate terminal, wherein the first voltage level comprises a voltage level of approximately a gate-source threshold level less than a voltage level of a signal applied to the gate terminal.

3. The method of claim 1, wherein the first voltage level is limited to a magnitude of approximately 0.4V and wherein the second voltage level comprises a magnitude of approximately 1.2V.

4. The method of claim 2, wherein the sensing the impedance state of the one or more correlated electron switch elements includes enabling the electronic switch circuit via the signal applied to the gate terminal of the electronic switch device.

5. The method of claim 4, wherein the signal applied to the gate terminal comprises a voltage level of approximately 0.5V.

6. The method of claim 1, wherein, at least in part in response to a de-assertion of a precharge signal, the sensing the impedance state of the one or more correlated electron switch elements includes transitioning an output signal of a sense amplifier to an asserted state at a first point in time at least in part in response to the impedance state of the one or more correlated electron switch elements comprising a relatively lower impedance state.

7. The method of claim 6, wherein, at least in part in response to the de-assertion of the precharge signal, the sensing the impedance state of the one or more correlated electron switch elements includes transitioning the output signal of the sense amplifier to the asserted state at a second point in time at least in part in response to the impedance state of the one or more correlated electron switch elements comprising a relatively higher impedance state.

8. The method of claim 7, wherein the sensing the impedance state of the one or more correlated electron switch elements further comprises latching the output signal of the sense amplifier during a period of time between the first point in time and the second point in time.

9. The method of claim 1, further comprising injecting a compensation current onto the bit-line at least in part to compensate for leakage current through the one or more correlated electron switch elements.

10. An apparatus, comprising:
one or more correlated electron switch elements coupled to an electronic switch buffer via a bit-line, the electronic switch buffer further coupled to sense amplifier circuitry via a sense amplifier input node, the bit-line to be precharged to a first voltage level and the sense amplifier input node to be precharged to a second voltage level, wherein the second voltage level is greater than the first voltage level, wherein the first voltage level to be limited to a particular threshold level to prevent spurious reset conditions for the one or more correlated electron switch elements during sensing operations and wherein an impedance state of the one or more correlated electron switch elements to be sensed by the sense amplifier circuitry at least in part in response to a discharge of the bit-line through the one or more correlated electron switch elements and of the sense amplifier input node through the electronic switch buffer.

11. The apparatus of claim 10, wherein the electronic switch buffer to comprise a transistor to include a source terminal and a drain terminal and further to include a gate terminal, the first voltage level to comprise a voltage level of approximately a gate-source threshold level less than a voltage level of a signal applied to the gate terminal.

12. The apparatus of claim 10, the first voltage level to be limited to a magnitude of approximately 0.4V and the second voltage level to comprise a magnitude of approximately 1.2V.

13. The apparatus of claim 11, wherein, to sense the impedance state of the one or more correlated electron switch elements, the electronic switch buffer to be enabled via the signal applied to the gate terminal of the electronic switch buffer.

14. The apparatus of claim 13, wherein the signal applied to the electronic switch buffer to comprise a voltage level of approximately 0.5V.

15. The apparatus of claim 10, wherein, at least in part in response to a de-assertion of a precharge signal, an output signal of the sense amplifier circuitry to transition to an asserted state at a first point in time at least in part in response to the impedance state of the one or more correlated electron switch elements comprising a relatively lower impedance state.

16. The apparatus of claim 15, wherein, at least in part in response to the de-assertion of the precharge signal, the output signal of the sense amplifier circuitry to transition to the asserted state at a second point in time at least in part in response to the impedance state of the one or more correlated electron switch elements comprising a relatively higher impedance state.

17. The apparatus of claim 16, wherein the sense amplifier circuitry to latch the output signal of the sense amplifier circuitry during a period of time between the first point in time and the second point in time.

18. The apparatus of claim 10, further comprising a compensation circuit, to include one or more correlated electron switch devices, to inject a compensation current onto the bit-line at least in part to compensate for leakage current through the one or more correlated electron switch elements.

19. A method, comprising:
precharging a first bit-line segment electrically coupled to one or more correlated electron switch elements to a first voltage level and precharging a second bit-line segment electrically coupled to sense amplifier circuitry to a second voltage level greater in magnitude than the first voltage level, wherein the first bit-line segment is buffered from the second bit-line segment via an electronic switch circuit to limit the first voltage level to a particular voltage level to prevent spurious reset conditions for the one or more correlated electron switch elements during sensing operations; and
sensing an impedance state of the one or more correlated electron switch elements at least in part by enabling the electronic switch circuit via an additional voltage level greater than the first voltage level and lower than the second voltage level.

20. The method of claim 19, wherein the sensing the impedance state of the one or more correlated electron switch elements further comprises:
at least in part in response to a de-assertion of a precharge signal:
transitioning an output signal of the sense amplifier circuitry to an asserted state at a first point in time at least in part in response to the impedance state of the one or more correlated electron switch elements comprising a relatively lower impedance state;
transitioning the output signal of the sense amplifier circuitry to the asserted state at a second point in time at least in part in response to the impedance state of the one or more correlated electron switch elements comprising a relatively higher impedance state; and
latching the output signal of the sense amplifier circuitry during a period of time between the first point in time and the second point in time.

* * * * *